United States Patent
Laliberte et al.

(10) Patent No.: US 10,189,098 B2
(45) Date of Patent: Jan. 29, 2019

(54) DIAGNOSTIC AND MAINTENANCE OPERATION FOR A SAW

(71) Applicants: Robert Bosch Tool Corporation, Broadview, IL (US); Robert Bosch GmbH, Stuttgart (DE)

(72) Inventors: Eric Laliberte, Naperville, IL (US); Timothy Szweda, Chicago, IL (US); Bharadwaja Maharshi Ramaswamy, Bangalore (IN); Niranjan Sathyanarayanarao Krishnarao, Bangalore (IN); Triveni Prabhu, Bangalore (IN); Reshma Hanamanthraddi Neelaraddi, Bangalore (IN)

(73) Assignees: Robert Bosch Tool Corporation, Broadview, IL (US); Robert Bosch GmbH, Stuttgart (DE)

( * ) Notice: Subject to any disclaimer, the term of this patent is extended or adjusted under 35 U.S.C. 154(b) by 272 days.

(21) Appl. No.: 15/060,664

(22) Filed: Mar. 4, 2016

(65) Prior Publication Data

US 2016/0263674 A1 Sep. 15, 2016

Related U.S. Application Data

(60) Provisional application No. 62/131,977, filed on Mar. 12, 2015, provisional application No. 62/132,004, filed on Mar. 12, 2015.

(51) Int. Cl.
*G08B 21/00* (2006.01)
*B23D 59/00* (2006.01)
(Continued)

(52) U.S. Cl.
CPC ......... *B23D 59/001* (2013.01); *B23D 45/067* (2013.01); *B23D 47/08* (2013.01); *B27G 19/02* (2013.01); *G01R 31/343* (2013.01)

(58) Field of Classification Search
CPC .... B23D 59/001; B23D 45/067; B23D 47/08; G01R 31/343; B27G 19/02; B27B 5/38;
(Continued)

(56) References Cited

U.S. PATENT DOCUMENTS 4,161,272 A 7/1979 Brockl
4,616,447 A 10/1986 Haas et al.
(Continued)

FOREIGN PATENT DOCUMENTS

DE 20007037 7/2000
DE 202004012468 11/2004
(Continued)

OTHER PUBLICATIONS

International Search Report and Written Opinion corresponding to PCT Application No. PCT/US2016/021764, dated Jun. 22, 2016 (11 pages).
(Continued)

*Primary Examiner* — Anh V La
(74) *Attorney, Agent, or Firm* — Maginot Moore & Beck LLP

(57) ABSTRACT

A method for measuring brush wear in a motor of a saw includes generating, with a sensor connected to a brush in a motor of the saw, a first signal corresponding to a level of wear in the brush and identifying, with a controller, a level of wear for the brush with reference to the first signal. The method further includes generating, with the controller and a user interface device, an output requesting replacement of the brush in response to the identified level of wear exceeding a predetermined threshold.

10 Claims, 21 Drawing Sheets

(51) Int. Cl.
 *B27G 19/02* (2006.01)
 *B23D 47/08* (2006.01)
 *B23D 45/06* (2006.01)
 *G01R 31/34* (2006.01)

(58) Field of Classification Search
 CPC ... B27B 5/222; Y10T 83/081; Y10T 83/8773; Y10T 83/141; Y10T 83/7788; Y10T 83/089; Y10T 83/613; Y10T 83/773; Y10T 83/7697; Y10T 83/088
 USPC .................. 340/648, 686.1, 679, 680, 686.3
 See application file for complete search history.

(56) References Cited

U.S. PATENT DOCUMENTS

| | | | |
|---|---|---|---|
| 5,676,319 A | 10/1997 | Stiggins et al. | |
| 6,359,690 B1 | 3/2002 | Discenzo et al. | |
| 6,536,536 B1 | 3/2003 | Gass et al. | |
| 6,813,983 B2 | 11/2004 | Gass et al. | |
| 6,826,988 B2 | 12/2004 | Gass et al. | |
| 6,834,730 B2 | 12/2004 | Gass et al. | |
| 6,857,345 B2 | 2/2005 | Gass et al. | |
| 6,877,410 B2 | 4/2005 | Gass et al. | |
| 6,880,440 B2 | 4/2005 | Gass et al. | |
| 6,920,814 B2 | 7/2005 | Gass et al. | |
| 6,922,153 B2 | 7/2005 | Pierga et al. | |
| 6,945,148 B2 | 9/2005 | Gass et al. | |
| 6,945,149 B2 | 9/2005 | Gass et al. | |
| 6,957,601 B2 | 10/2005 | Gass et al. | |
| 6,994,004 B2 | 2/2006 | Gass et al. | |
| 6,997,090 B2 | 2/2006 | Gass et al. | |
| 7,000,514 B2 | 2/2006 | Gass et al. | |
| 7,024,975 B2 | 4/2006 | Gass et al. | |
| 7,029,384 B2 | 4/2006 | Steimel et al. | |
| 7,055,417 B1 | 6/2006 | Gass | |
| 7,077,039 B2 | 7/2006 | Gass et al. | |
| 7,093,668 B2 | 8/2006 | Gass et al. | |
| 7,098,800 B2 | 8/2006 | Gass | |
| 7,100,483 B2 | 9/2006 | Gass et al. | |
| 7,121,358 B2 | 10/2006 | Gass et al. | |
| 7,137,326 B2 | 11/2006 | Gass et al. | |
| 7,171,879 B2 | 2/2007 | Gass et al. | |
| 7,197,969 B2 | 4/2007 | Gass et al. | |
| 7,210,383 B2 | 5/2007 | Gass et al. | |
| 7,225,712 B2 | 6/2007 | Gass et al. | |
| 7,228,772 B2 | 6/2007 | Gass | |
| 7,231,856 B2 | 6/2007 | Gass et al. | |
| 7,284,467 B2 | 10/2007 | Gass et al. | |
| 7,290,472 B2 | 11/2007 | Gass et al. | |
| 7,290,967 B2 | 11/2007 | Steimel et al. | |
| 7,308,843 B2 | 12/2007 | Gass et al. | |
| 7,328,752 B2 | 2/2008 | Gass et al. | |
| 7,347,131 B2 | 3/2008 | Gass | |
| 7,350,444 B2 | 4/2008 | Gass et al. | |
| 7,350,445 B2 | 4/2008 | Gass et al. | |
| 7,353,737 B2 | 4/2008 | Gass et al. | |
| 7,357,056 B2 | 4/2008 | Gass et al. | |
| 7,359,174 B2 | 4/2008 | Gass | |
| 7,373,863 B2 | 5/2008 | O'Banion et al. | |
| 7,377,199 B2 | 5/2008 | Gass et al. | |
| 7,421,315 B2 | 9/2008 | Gass et al. | |
| 7,472,634 B2 | 1/2009 | Gass et al. | |
| 7,475,542 B2 | 1/2009 | Borg et al. | |
| 7,481,140 B2 | 1/2009 | Gass et al. | |
| 7,509,899 B2 | 3/2009 | Gass et al. | |
| 7,525,055 B2 | 4/2009 | Gass et al. | |
| 7,536,238 B2 | 5/2009 | Gass | |
| 7,540,334 B2 | 6/2009 | Gass et al. | |
| 7,591,210 B2 | 9/2009 | Gass et al. | |
| 7,600,455 B2 | 10/2009 | Gass et al. | |
| 7,739,934 B2 | 6/2010 | Tetelbaum et al. | |
| 7,827,889 B2 | 11/2010 | Carrier | |
| 7,888,826 B1 | 2/2011 | Shafer et al. | |
| 8,186,256 B2 | 5/2012 | Carrier | |
| 8,186,258 B2 | 5/2012 | Chung | |
| 8,210,076 B2 | 7/2012 | Oberheim | |
| 8,245,612 B2 | 8/2012 | Chung et al. | |
| 8,250,957 B2 | 8/2012 | Holmes et al. | |
| 8,286,537 B2 | 10/2012 | Fischer et al. | |
| 8,291,801 B2 | 10/2012 | Chung et al. | |
| 8,297,159 B2 | 10/2012 | Voruganti et al. | |
| 8,316,748 B2 | 11/2012 | Chung et al. | |
| 8,327,744 B2 | 12/2012 | Groth et al. | |
| 8,648,016 B2 | 2/2014 | Kavusi et al. | |
| 9,079,258 B2 | 7/2015 | Chung | |
| 2003/0111095 A1* | 6/2003 | Sugarman | B08B 1/04 134/6 |
| 2004/0159198 A1 | 8/2004 | Peot et al. | |
| 2008/0164833 A1* | 7/2008 | Kajikawa | H02P 29/0241 318/565 |
| 2008/0291273 A1* | 11/2008 | Cutsforth | H01R 39/58 348/143 |
| 2011/0226105 A1 | 9/2011 | Butler et al. | |
| 2013/0218514 A1* | 8/2013 | Schieke | H01R 39/58 702/138 |
| 2014/0090530 A1 | 4/2014 | Haldar et al. | |
| 2014/0090860 A1 | 4/2014 | Ramaswamy et al. | |
| 2014/0091918 A1 | 4/2014 | Pfeffer et al. | |
| 2014/0107853 A1* | 4/2014 | Ashinghurst | G05B 19/048 700/297 |
| 2014/0265675 A1* | 9/2014 | Cutsforth | H01R 39/58 310/73 |

FOREIGN PATENT DOCUMENTS

| | | |
|---|---|---|
| JP | H11275818 A | 10/1999 |
| JP | 2003153583 A | 5/2003 |

OTHER PUBLICATIONS

Photograph of Mafell Erika 70Ec Pull-Push saw, downloaded Oct. 29, 2009 from http://timberwolftools.com/tools/mafell/images/MAF-ERIKA70Ec-b.jpg.

* cited by examiner

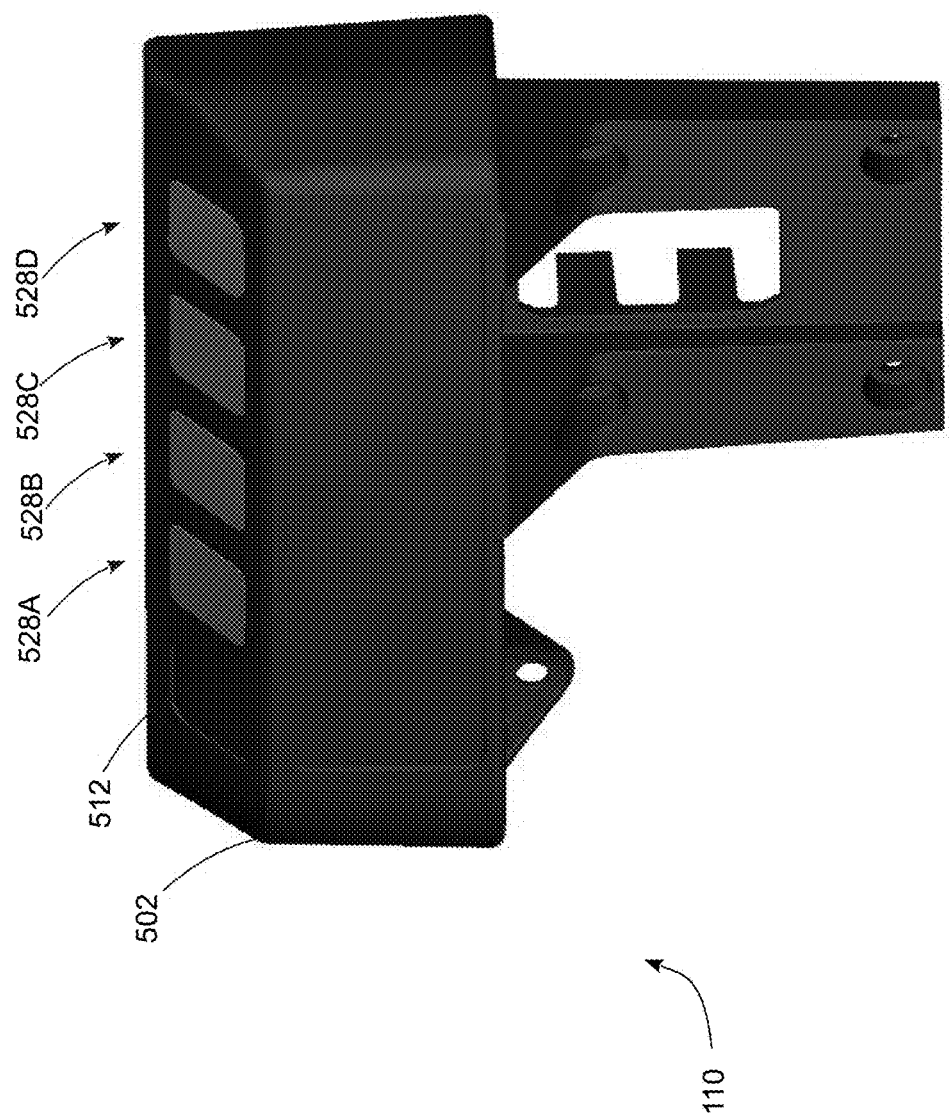

DIAGNOSTIC AND MAINTENANCE OPERATION FOR A SAW

CLAIM OF PRIORITY

This application claims priority to U.S. Provisional Application No. 62/131,977, which is entitled "SYSTEM AND METHOD FOR CONTROL OF A DROP ARM IN A TABLE SAW," and was filed on Mar. 12, 2015, the entire contents of which are hereby incorporated by reference herein. This application also claims priority to U.S. Provisional Application No. 62/132,004, which is entitled "TABLE SAW WITH DROPPING BLADE," and was filed on Mar. 12, 2015, the entire contents of which are hereby incorporated by reference herein.

CROSS REFERENCE

This application cross-references U.S. application Ser. No. 15/060,649 (issued as U.S. Pat. No. 9,914,239), which was filed on Mar. 4, 2016, the entire contents of which are hereby incorporated by reference herein. This application further cross-references copending U.S. application Ser. No. 15/060,656, which was filed on Mar. 4, 2016, the entire contents of which are hereby incorporated by reference herein. This application further cross-references copending U.S. application Ser. No. 15/060,670, which was filed on Mar. 4, 2016, the entire contents of which are hereby incorporated by reference herein. This application further cross-references copending U.S. application Ser. No. 15/060,709, which was filed on Mar. 4, 2016, the entire contents of which are hereby incorporated by reference herein. This application further cross-references copending U.S. application Ser. No. 15/060,742, which was filed on Mar. 4, 2016, the entire contents of which are hereby incorporated by reference herein.

FIELD

This disclosure relates generally to power tools, and, more specifically, to systems and methods for performing diagnostics and maintenance in a saw that detects contact between an implement and objects.

BACKGROUND

Detection or sensing systems have been developed for use with various kinds of manufacturing equipment and power tools. Such detection systems are operable to trigger a reaction device by detecting or sensing the proximity or contact of some appendage of an operator with some part of the equipment. For example, existing capacitive contact sensing systems in table saws detect contact between the operator and the blade.

FIG. 1 depicts a prior art capacitive sensing based detection system 90 that is incorporated with a table saw 1. The detection system 90 drives an excitation voltage that is electrically coupled to a movable blade 22 of the saw 1, and detects the current drawn from the blade 22. The amplitude or phase of the detected current and/or excitation voltage changes when the blade 22 comes into contact with an electrically conductive object (such as an operator's hand, finger or other body part, as well as work pieces). The characteristics of the changes are used to trigger the operation of a reaction system 92. The reaction system 92 disables operation of the blade 22 by, for example, applying a brake to cease motion of the blade 22 and/or by moving the blade 22 below the cutting area. One example of a reaction system 92 uses an explosive charge to drive a brake (not shown) into the blade 22 to arrest the motion of the blade 22. In addition, or instead, an embodiment of the reaction system 92 collapses a blade support member (not show) to urge the blade 22 below the surface of the table 14.

The embodiment of the detection system 90 shown in FIG. 1 includes an oscillator 10 that generates a time-varying signal on line 12. The time-varying signal is any suitable signal type including, for example, a sine wave, a sum of multiple sine waves, a chirp waveform, a noise signal, etc. The frequency of the signal is chosen to enable a detection system to distinguish between contact with the first object, such as a finger or hand, and a second object, such as wood or other material, to be cut by the power tool. In the embodiment of FIG. 1, the frequency is 1.22 MHz, but other frequencies can also be used, as well as non-sinusoidal wave shapes. The oscillator 10 is referenced to the saw table 14 or other metallic structure as a local ground. As shown in FIG. 1, the blade 22 is disposed vertically in an opening defined by the saw table 14 (or work surface or cutting surface or platform).

The oscillator 10 is connected to two voltage amplifiers or buffers 16, 18 through the line 12. The first voltage amplifier 16 has an output connected to line 20, which operatively connects the output of the oscillator to the saw blade 22. A current sensor 24 operatively connects a signal from line 20 onto line 26 that is fed to an amplifier 28, which is connected to a processor 30 by line 32. The current sensor 24 is, for example, a current sense transformer, a current sense resistor, a Hall Effect current sense device, or other suitable type of current sensor. An output line 34 from the processor 30 is operatively connected to the reaction system 92 so that the processor 30 triggers the reaction system 92 if predetermined conditions are detected indicating, for example, contact between the blade 22 and the first object.

The signal on line 26 is indicative of the instantaneous current drawn by the blade 22. Because the saw blade 22 is in motion during operation of the table saw, the connection is made through an excitation plate 36, which is mounted generally parallel to the blade 22. The plate 36 is driven by the first voltage amplifier 16, and is configured with a capacitance of approximately 100 picoFarad (pF) relative to the blade 22 in the embodiment of FIG. 1. The plate 36 is held in a stable position relative to the side of the blade 22. The excitation plate 36 is configured to follow the blade 22 as the height and bevel angle of the blade 22 are adjusted during operation of the saw 1.

The capacitance between the first object and the saw table 14 (or power line ground if one is present) is in the range of approximately 30-50 pF in the embodiment of FIG. 1. When the capacitance between the excitation plate 36 and the saw blade 22 exceeds the capacitance between the first object and the saw table 14, the detection thresholds are not unduly affected by changes in the plate-to-blade capacitance. In the configuration of FIG. 1, the plate 36 is arranged in parallel with the blade 22 on the side where the blade 22 rests against the arbor 37, so that changes in blade thickness do not affect the clearance between the blade 22 and the plate 36. Other methods of excitation, including contact through the arbor bearings or brush contact with the shaft or the blade, could be used to the same effect.

In the detection system 90, the second-amplifier 18 is connected to a shield 38, and the amplifier 18 drives the shield 38 to the same potential as the excitation plate 36. Also, sensors in the detection system 90 optionally monitor the level of electrical current drawn by the shield 38. The shield 38 extends around the blade 22 underneath the table 14, and is spaced some distance away from the blade 22 on the top of the table 14 in the configuration of FIG. 1. The configuration of the shield 38 reduces the static capacitance between the blade 22 and the table 14, which acts as a ground plane if the table is not electrically connected to an earth ground. In various embodiments, the shield 38 is a continuous pocket of mesh, or some other type of guard that is electrically equivalent to a Faraday cage at the excitation frequencies generated by the oscillator 10. The shield 38 optionally includes a component that moves with the blade adjustments, or is large enough to accommodate the blade's adjustment as well as the various blades that fitted on the table saw. In the configuration of FIG. 1, the shield 38 moves with the blade adjustments, and includes a throat plate area of the table top 14.

The processor 30 performs various pre-processing steps and implements a trigger that enables detection of conditions indicative of contact between the first object and the blade 22. The processor 30 optionally includes one or more associated analog-to-digital (A/D) converters. The blade current signal from the current sensor 24 is directed to one or more of the A/D converters, which generate a corresponding digital signal. A blade voltage signal representing the voltage difference between the blade 22 and the excitation plate 36 is directed an A/D converter to generate a digital blade voltage signal in some embodiments. The processor 30 receives the digitized signal and performs various digital signal processing operations and/or computes derivative parameters based on the received signal. The processor 30 analyzes or otherwise performs operations on the conditioned blade signal to detect conditions indicative of contact between the first object and the blade 22.

The prior art saw requires that the blade 22 be formed from an electrically conductive material that is also electrically connected to the arbor 37. Non-conductive blades and blades that include non-conductive coatings prevent proper operation of the contact detection system in the prior art saws. Additionally, the blade 22 and arbor 37 must be electrically connected to a ground plane for the contact detection system to operate effectively. The requirement for a ground connection to the blade also requires the saw 1 to be electrically connected to a proper ground, such as a ground spike, metal pipe, or other suitable ground, which requires that the table saw 1 remain in a fixed location. Other types of table saws include portable table saws that are transported between job sites where providing a ground connection may be inconvenient or impractical. Additionally, the requirement for a ground connection increases the complexity of setup and operation of non-portable table saws. Consequently, improvements to contact detection systems that do not require an electrical ground connection for the blade in portable and non-portable table saws would be beneficial.

SUMMARY

In one embodiment, a method for monitoring brush wear in a motor of a saw has been developed. The method includes generating, with a sensor connected to a brush in a motor of the saw, a first signal corresponding to a level of wear in the brush, identifying, with a controller, a level of wear for the brush with reference to the first signal, and generating, with the controller and a user interface device, an output requesting replacement of the brush in response to the identified level of wear exceeding a predetermined threshold.

In a further embodiment, the method includes generating, with a current source in the motor, an electrical signal that passes through the brush, identifying, with the controller, a level of electrical resistance through the brush with reference to the first signal from the sensor, and identifying, with the controller, that the level of wear in the brush exceeds the predetermined threshold in response to the level of electrical resistance being below a predetermined threshold.

In a further embodiment, the method includes generating with the sensor the first signal corresponding to at least one of a level of electrical current or voltage in the brush.

In a further embodiment, the method includes generating, with the sensor, the first signal corresponding to a level of pressure exerted upon the sensor from a spring that biases the brush into contact with a commutator in the motor, and identifying, with the controller, that the level of wear in the brush exceeds the predetermined threshold in response to the level of pressure being below a predetermined threshold.

In a further embodiment, the method includes disabling, with the controller, operation of the motor in response to the identified level of wear exceeding the predetermined threshold.

In a further embodiment, the sensor generates the first signal during a diagnostic mode in which the motor is deactivated.

In another embodiment, a system for measuring brush wear of a motor in a saw has been developed. The system includes a motor in a saw, a brush in the motor, a sensor in the motor, the sensor being configured to generate a first signal corresponding to a level of wear in the brush, a user interface device, and a controller operatively connected to the motor, the sensor, and the user interface device. The controller is configured to receive the first signal from the sensor, identify a level of wear for the brush with reference to the first signal, and operate the user interface device to generate an output requesting replacement of the brush in response to the identified level of wear exceeding a predetermined threshold.

In a further embodiment, the system includes a current source in the motor configured to generate an electrical signal that passes through the brush and the sensor is configured to generate the first signal corresponding to at least one of a level of electrical current or voltage in the brush. The controller is configured to identify a level of electrical resistance through the brush with reference to the first signal from the sensor, and identify that the level of wear in the brush exceeds the predetermined threshold in response to the level of electrical resistance being below a predetermined threshold.

In a further embodiment, the sensor in the system is configured to generate the first signal corresponding to a level of pressure exerted upon the sensor from a spring that biases the brush into contact with a commutator in the motor. The controller is configured to identify that the level of wear in the brush exceeds the predetermined threshold in response to the level of pressure being below a predetermined threshold.

In a further embodiment, the controller is further configured to disable operation of the motor in response to the identified level of wear exceeding the predetermined threshold.

In a further embodiment, the sensor generates the first signal during a diagnostic mode in which the motor is deactivated.

In another embodiment, a method for operation of a saw with an implement reaction mechanism has been developed. The method includes detecting, with an object detection system in the saw, contact between an object other than a work piece and an implement in the saw during operation of the saw, activating, with the object detection system, the implement reaction mechanism in the saw, incrementing, with a controller in the object detection system, a counter in a memory corresponding to a number of times that the implement reaction mechanism has been activated, and disabling, with the controller, operation of the saw in response to the counter exceeding a predetermined threshold.

In a further embodiment, the method includes resetting, with an external programming device, the counter in the memory during a maintenance operation, and enabling, with the controller, operation of the saw in response to the counter being reset.

In a further embodiment, the method includes generating, with a user interface device, an output indicating that the saw is disabled and requires service in response to the counter exceeding the predetermined threshold.

BRIEF DESCRIPTION OF THE DRAWINGS

FIG. 5A is an external view of a user interface device in the saw of FIG. 2.

DETAILED DESCRIPTION

For the purposes of promoting an understanding of the principles of the embodiments described herein, reference is now made to the drawings and descriptions in the following written specification. No limitation to the scope of the subject matter is intended by these references. This patent also encompasses any alterations and modifications to the illustrated embodiments as well as further applications of the principles of the described embodiments as would normally occur to one skilled in the art to which this document pertains.

As used herein, the term "power tool" refers to any tool with one or more moving parts that are moved by an actuator, such as an electric motor, an internal combustion engine, a hydraulic or pneumatic cylinder, and the like. For example, power tools include, but are not limited to, bevel saws, miter saws, table saws, circular saws, reciprocating saws, jig saws, band saws, cold saws, cutters, impact drives, angler grinders, drills, jointers, nail drivers, sanders, trimmers, and routers. As used herein, the term "implement" refers to a moving part of the power tool that is at least partially exposed during operation of the power tool. Examples of implements in power tools include, but are not limited to, rotating and reciprocating saw blades, drill bits, routing bits, grinding disks, grinding wheels, and the like. As described below, a sensing circuit integrated with a power tool is used to halt the movement of the implement to avoid contact between a human operator and the implement while the implement is moving.

As used herein, the term "implement reaction mechanism" refers to a device in a saw that retracts an implement, such as a blade or any other suitable moving implement, from a location with potential contact with a work piece or a portion of the body of a human operator, that halts the motion of the implement in a rapid manner, or that both retracts and halts the implement. As described below in a table saw embodiment, one form of implement reaction mechanism includes a movable drop arm that is mechanically connected to an implement, such as a blade, and an arbor. The implement reaction mechanism includes a pyrotechnic charge that is operated by an object detection system in response to detection of contact between a portion of the body of an operator and the blade during operation of the saw. The pyrotechnic charges force the drop arm and blade below the surface of the table to retract the blade from contact with the operator in a rapid manner. In other embodiments of the implement reaction mechanism, a mechanical or electromechanical blade brake halts the movement of the blade in a rapid manner.

Figure 1:
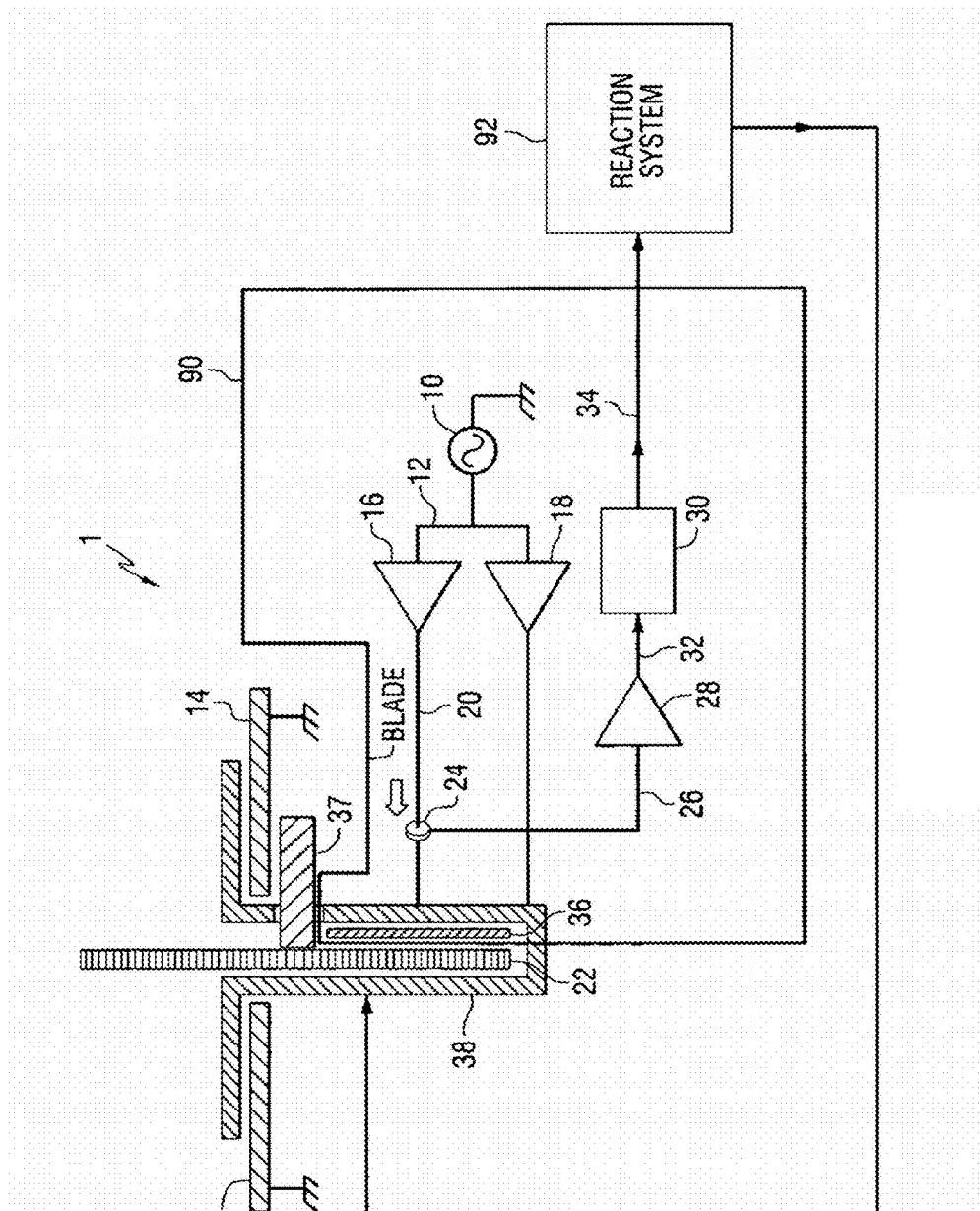
FIG. 1 is a diagram of a prior art table saw including a prior art detection system for detecting contact between a human and a saw blade.
Figure 2:
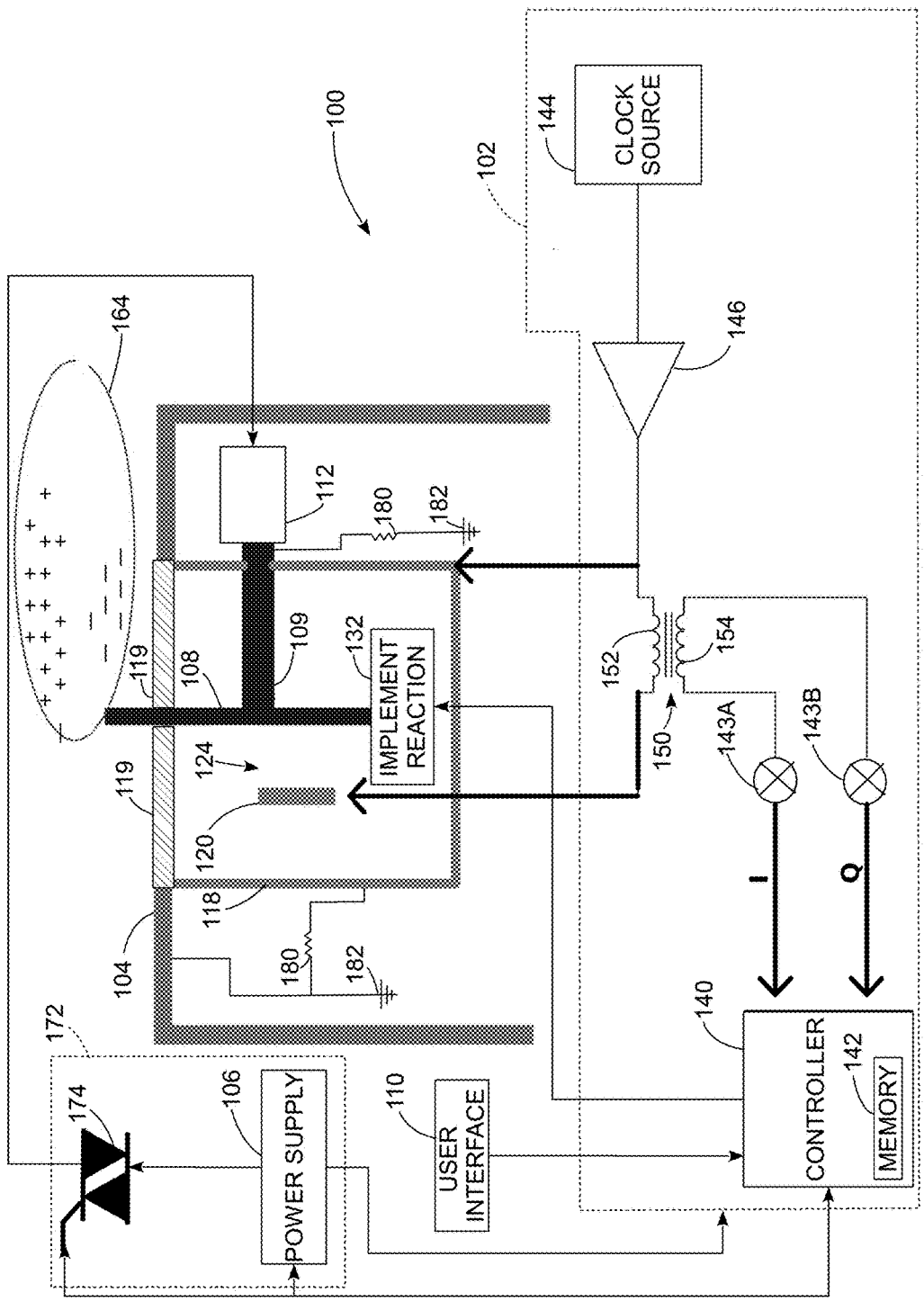
FIG. 2 is a schematic diagram of a table saw including an object detection system configured to identify if a saw blade in the saw contacts an object during rotation of the saw blade.
Figure 3:
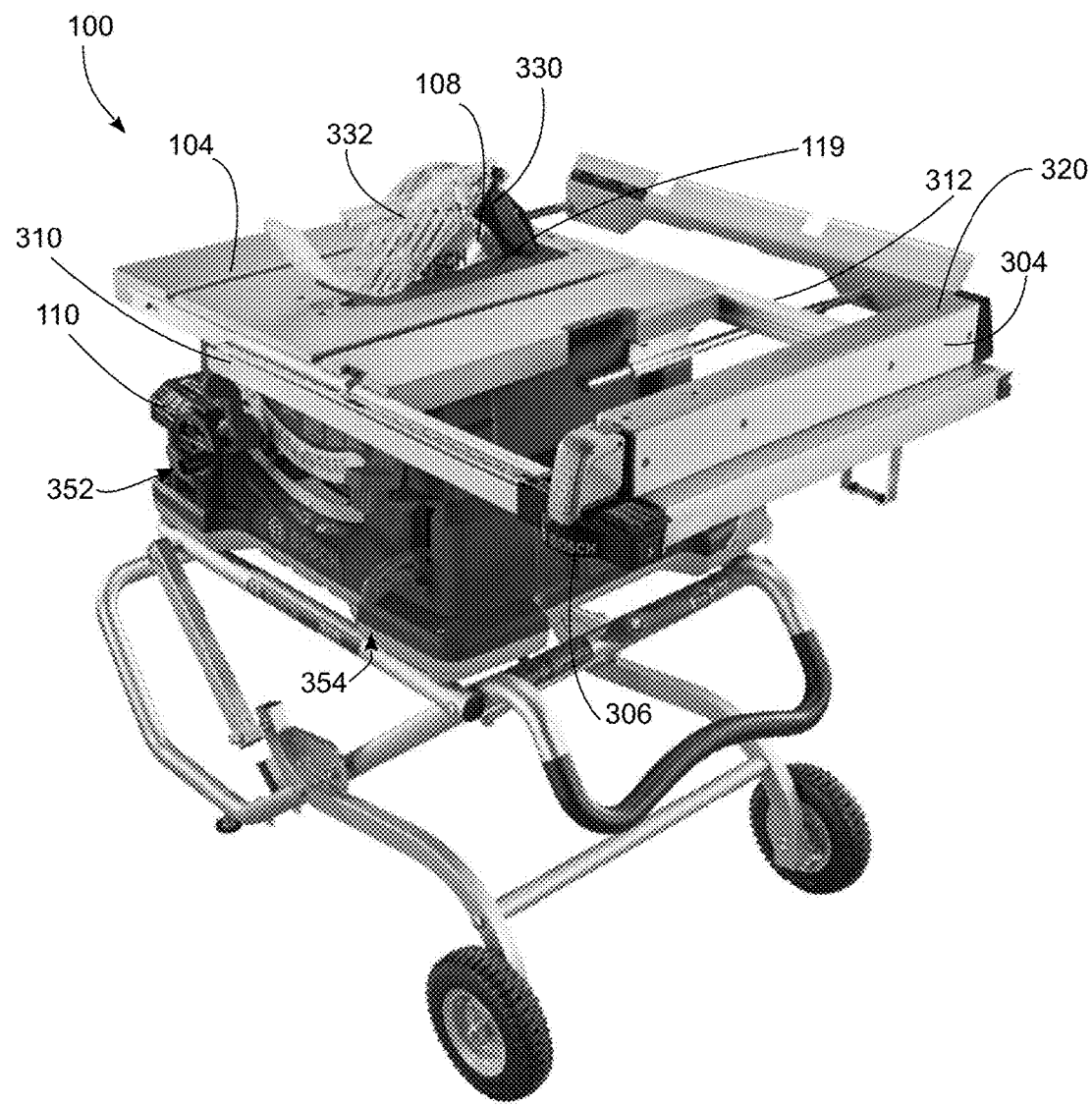
FIG. 3 is an external view of one embodiment of the table saw of FIG. 2.

FIG. 2 depicts a schematic view of components in a saw 100, while FIG. 3 depicts an external view of one embodiment of the saw 100. The table saw 100 includes a table 104 through which a saw blade 108 extends for cutting work pieces, such as pieces of wood. The table saw 100 also includes an electric motor 112 that rotates an arbor 109 to drive the saw blade 108, an implement enclosure 118, and an implement reaction mechanism 132. While FIG. 2 depicts a cutting blade 108 for illustrative purposes, those of skill in the art will recognize that the blade 108 may be any implement that can be used in the saw 100 and that the references to the blade 108 are for illustrative purposes. In the saw 100, the implement enclosure 118 includes a height adjustment carriage and a bevel carriage that surround the blade 108, and the implement enclosure 118 is alternatively referred to as a blade enclosure or "shield" that surrounds the blade 108 or other suitable implement in the saw 100. As depicted in FIG. 3, a portion of the blade 108 extends upward through an opening in the throat plate 119 above the surface of the table 104. A riving knife 330 and blade guard 332 are positioned over the blade 108.

Within the saw 100, the implement enclosure 118 is electrically isolated from the blade 108, arbor 109, the top surface of the table 104, and a plate 120. In one embodiment, the implement enclosure 118 includes a throat plate 119 that is formed from an electrical insulator, such as thermoplastic. The throat plate 119 includes an opening to enable the blade 108 to extend above the surface of the table 104. The throat plate 119 is level with the surface of the table 104 and provides further electrical isolation of the blade 108, height adjustment carriage, and bevel carriage in the implement enclosure 118 from the surface of the table 104. The general configuration of the table 104, blade 108, and motor 112 are well known to the art for use in cutting work pieces and are not described in greater detail herein. Some components that are commonly used in table saws, such as guides for work pieces, blade height adjustment mechanisms, and blade guards are omitted from FIG. 2 for clarity.

The saw 100 further includes an object detection system 102 that is includes a digital controller 140, memory 142, clock source 144, amplifier 146, transformer 150 and demodulators 143A and 143B. The object detection system 102 is electrically connected to the plate 120 and to the blade 108 via the implement enclosure 118 and arbor. The controller 140 in the object detection system 102 is operatively connected to the user interface device 110, motor 112, and implement reaction mechanism 132. During operation of the saw 100, the blade detection system 102 detects electrical signals that result from changes in the capacitance levels between the blade 108 and the plate 120 when an object contacts the rotating blade 108. An object can include a work piece, such as a piece of wood or other material that the saw 100 cuts during ordinary operation. The object detection system 102 also detects contact between the blade 102 and other objects, including potentially a hand or other portion of the body of the operator of the saw, and activates the implement reaction mechanism 132 in response to detection of contact between the blade 108 and objects other than work pieces. Additional structural and operational details of the object detection system 102 are described in more detail below.

In the saw 100, the table 104 is electrically isolated from the saw blade 108, arbor 109, and other components in the saw enclosure 118 as depicted in FIG. 2 and FIG. 3. In one embodiment, the surface of the table 104 is formed from an electrically conductive metal, such as steel or aluminum. At the surface of the table 104, the electrically non-conductive throat plate 119 isolates the blade 108 from the surface of the table 104. Under the table 104, one or more electrically insulated mounts that secure the table 104 to the frame of the saw 100 but electrically isolate the table 104 from other components within the saw. As depicted in FIG. 2, in some embodiments the table 104 is electrically connected to ground 182 with an electrical cable. The ground connection reduces or eliminates the buildup of static electricity on the table 104, which prevents errant static discharges that can reduce the accuracy of object detection during operation of the saw 100.

In addition to the ground connection for the table 104, the blade 108 and implement enclosure 118 are connected to the ground 182 through high resistance cables that incorporate large resistors 180 (e.g. 1 MΩ resistors). The implement enclosure 118 is connected to ground 182 through a first cable and a resistor 180 that provides a high-resistance connection to ground. The blade 108 is also connected to the ground 182 via the arbor 109 through a second cable and resistor 180. The high-resistance connections to ground for the blade 108 and implement enclosure 118 also reduce the buildup of static charge on these components. While prior art detection devices require a low-resistance ground connection (e.g. a direct connection using an electrical cable with a resistance of less than 1Ω) in order to detect contact between a blade and an object using a low-impedance connection directly to earth ground, the high-resistance ground cables in the saw 100 are not required for operation of the object detection system 102. Instead the high-resistance cables merely reduce the effects of static electricity in the saw 100 to reduce potential false-positive detection events, but the object detection system 102 is still fully functional to detect contact between the blade 108 and an object without any ground connection. Alternative embodiments use different materials for either or both of the plate 120 and blade 108 to reduce the buildup of static electricity in the saw 100 and do not require any connection between the blade 108 or implement enclosure 118 and ground.

The table saw 100 includes a rip fence 304 that is mounted on rails 310 and 312. The rip fence 304 is configured to move to a predetermined position over the table 304 with an orientation that is parallel to the blade 108 to guide work pieces through the saw 100 during operation. In the saw 100, the rip fence 304 is electrically isolated from the table 104. For example, in FIG. 3 an electrically insulated thermoplastic rail mount 306 couples the rip fence 304 to the rail 310. A plastic guard (not shown) on the bottom of the rip fence 304 and another guard 320 on the top of the rip fence 304 electrically isolate the rip fence 304 from the table 104 in the saw 100. In some embodiments, the rip fence 304 includes another electrical insulator positioned on the side of the rip fence 304 that faces the blade 108 to ensure electrical isolation between the rip fence 304 and the blade 108 when a work piece engages both the rip fence 304 and blade 108 simultaneously.

Referring again to FIG. 2, the saw 100 also includes the detection system 102 that detects contact between objects and the blade 108 during operation of the saw 100. In one configuration, some or all of the components in the detection system 102 are mounted to one or more printed circuit boards (PCBs). In the embodiment of FIG. 2, a separate PCB 172 supports a power supply 106 and a control TRIAC 174. The power supply 106 receives an alternating current (AC) electrical power signal from an external power source, such as a generator or electrical utility provider, and supplies electrical power to the motor 112 through the TRIAC 174 and to supply electrical power to the components in the sensing system 102. The separate PCBs for the sensing system 102 and power supply 172 isolate the digital controller 140 from the power supply 106 and TRIAC 174 to improve cooling of the digital electronics in the controller 140 and to isolate the controller 140 from electrical noise. In the embodiment of FIG. 2, the power supply 106 is a switched power supply that converts the AC power signal from an external power source to a direct current (DC) electrical power signal at one or more voltage levels to supply power to the controller 140, clock source 144, and amplifier 146. The detection system 102 and the components mounted on the detection system 102 are electrically isolated from an earth ground. The power supply 106 serves as a local ground for the components mounted to the detection system 102.

In the saw 100, the plate 120 and the blade 108 form a capacitor 124 where a small air gap between the plate 120 and the blade 108 acts as a dielectric. The plate 120 is an electrically conductive plate such as a steel or aluminum plate that is positioned at a predetermined distance from the blade 108 with a parallel orientation between the plate 120 and the blade 108 to form two sides of the capacitor 124 with an air gap dielectric. The transformer 150 includes a first winding 152 and a second winding 154. In the saw 100, the plate 120 is a metallic planar member that is electrically connected to the winding 152 in the transformer 150. The plate 120 is otherwise electrically isolated from the implement enclosure 118 and is electrically isolated from the blade 108 by a predetermined air gap to form the capacitor 124. The plate 120 is also referred to as a charge coupled plate (CCP) because the plate 120 forms one side of the capacitor 124 in conjunction with the blade 108. In one embodiment, a plastic support member holds the plate 120 in a predetermined position with respect to the blade 108. The blade 108 and blade arbor 109 are electrically isolated from the enclosure 118, plate 120, the drop arm in the implement reaction mechanism 132, and other components in the saw 100. For example, in the saw 100, one or more electrically insulated plastic bushings isolate the arbor 109 and blade 108 from the implement enclosure 118, the drop arm in the implement reaction mechanism 132, and other components in the saw 100. Additionally, the saw blade 108 and arbor 109 are electrically isolated from ground. Thus, the blade object detection system in the saw 100 operates in an "open loop" configuration where the capacitor 124 is formed from the plate 120 and the blade 108 while the blade 108 and arbor 109 remain electrically isolated from the other components in the saw 100. The open loop configuration increases the capacitance between the plate 120 and the saw blade 108 in comparison to the prior art sensing systems where the saw blade is electrically grounded. The larger capacitance in the saw 100 improves the signal to noise ratio for detection of a signal that indicates contact between a human operation and the saw blade 108.

As depicted in FIG. 2, the plate 120 is electrically connected to one side of the first winding 152 in the transformer 150 while the implement enclosure 118 is electrically connected to the other side of the first winding 152. In one embodiment, the saw 100 includes a single coaxial cable that includes two electrical conductors to establish the two electrical connections. In one configuration, the center conductor element of the coaxial cable is connected to the plate 120 and the first terminal of the first winding 152 in the transformer 150. The outer sheath of the coaxial cable is electrically connected to the blade 108 through the enclosure 118 and the arbor 109 and to the second terminal of the first winding in the transformer 150. The structure of the coaxial cable provides shielding to transmit the electrical signals from the plate 120 and implement enclosure 118 while attenuating electrical noise that is present in the saw 100.

Figure 4:
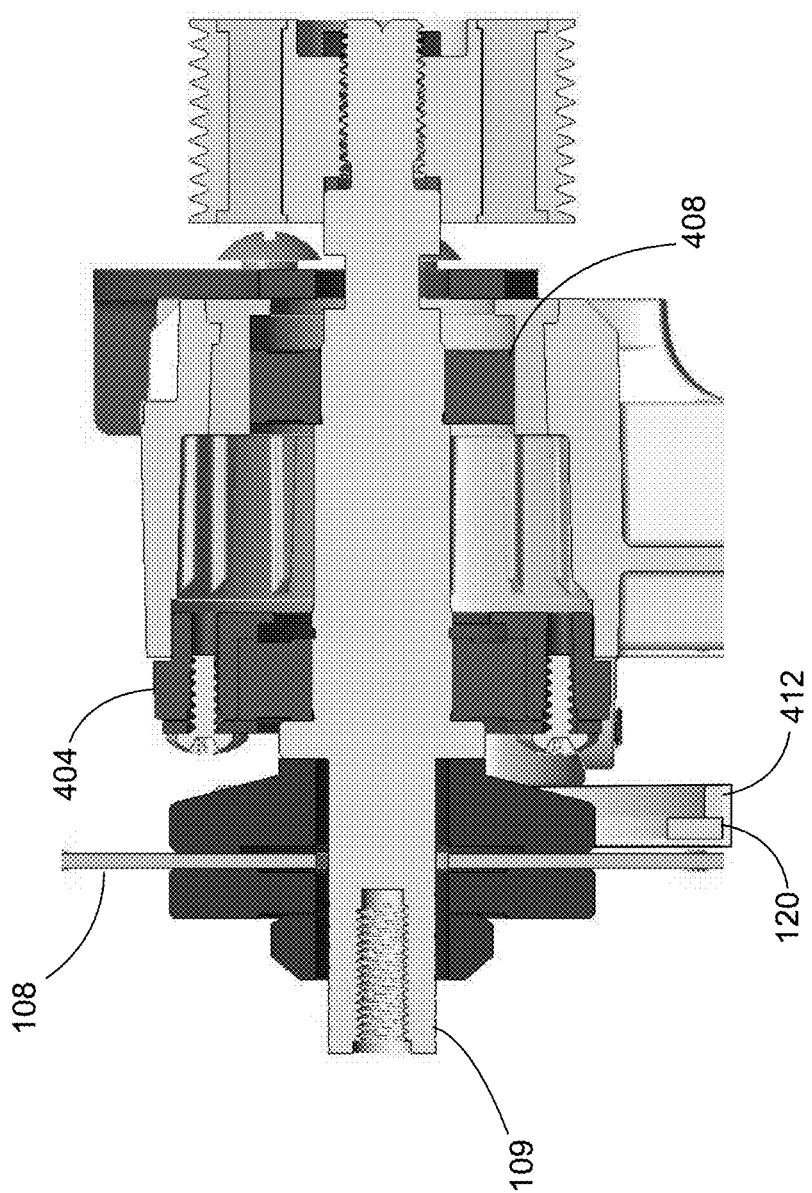
FIG. 4 is a cross-sectional view of selected components including the blade, arbor, and sensor plate in the saw of FIG. 2.

FIG. 4 depicts a cross-sectional view of the blade 108, arbor 109, and plate 120 in more detail. In FIG. 4, electrically nonconductive bushings 404 and 408 engage the arbor 109. The electrically nonconductive bushings 404 and 408 include, for example, layers of electrically insulated plastic, ceramic, or other insulators that electrically isolate the arbor 109 from other components in the saw 100. In the illustrative example of FIG. 4, the bushings 404 and 408 include bearings that enable the arbor 109 to rotate during operation. The blade 108 only physically engages the arbor 109, and remains electrically isolated from other components in the saw 100. In FIG. 4, a plastic support member 412 holds the plate 120 in position at a predetermined distance from the blade 108 while electrically isolating the plate 120 from other components in the saw 100.

Figure 6A:
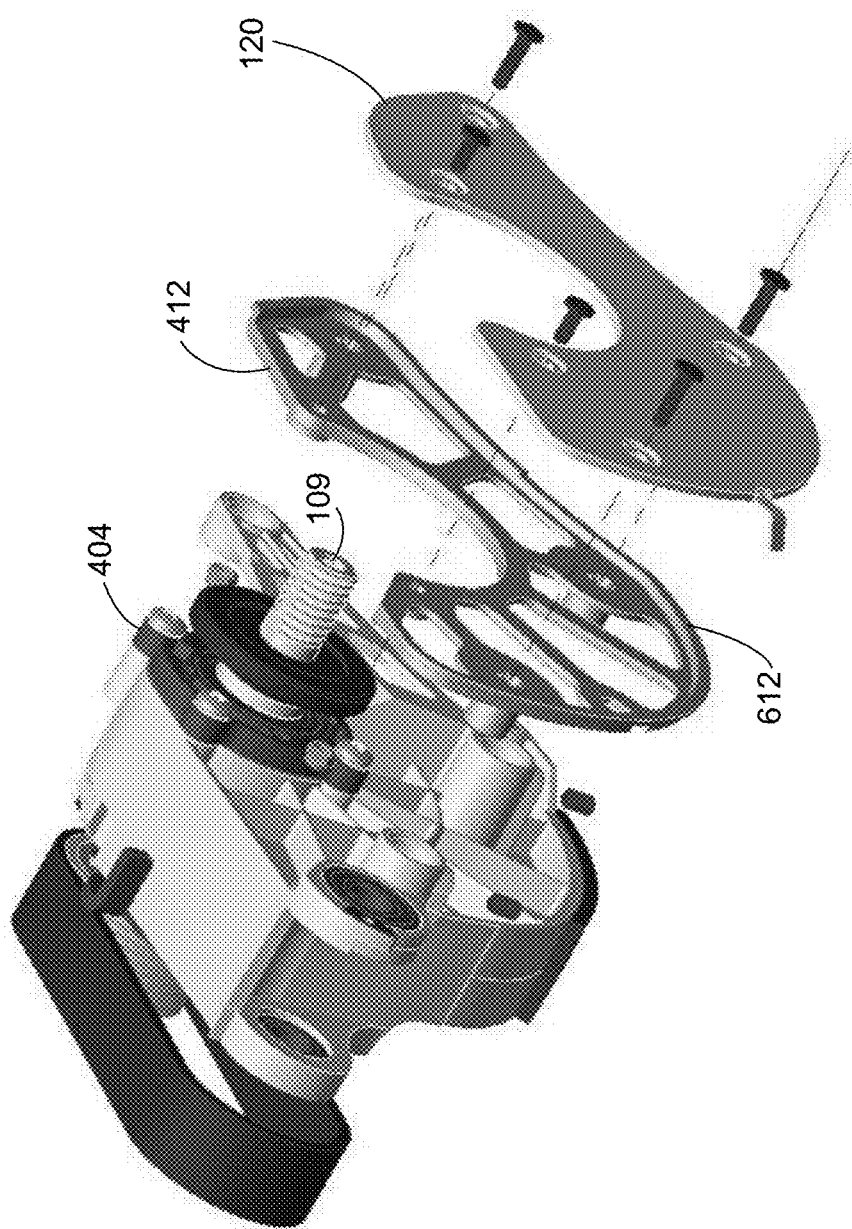
FIG. 6A is an exploded view of a charge coupled plate and arbor assembly in one embodiment of the saw of FIG. 2.
Figure 6B:
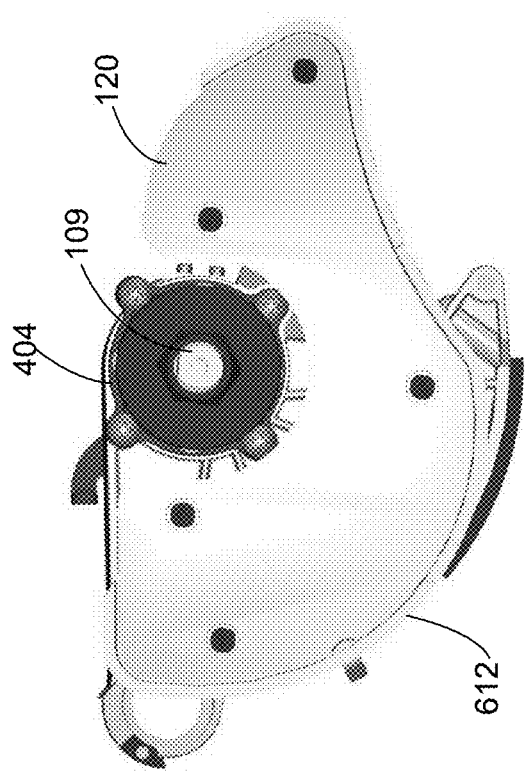
FIG. 6B is a profile view of the components depicted in FIG. 6A.

FIG. 6A and FIG. 6B depict an exploded and front view, respectively, of the components depicted in FIG. 4. FIG. 6A depicts the plate 120 and the support member 412, which are affixed to the support frame that holds the arbor 109 using a set of screws. To maintain electrical isolation between the plate 120 and the arbor 109 and other components in the enclosure 118, the screws are either electrically non-conductive or the threaded holes in the support frame include electrically non-conductive threadings to maintain the electrical isolation. The support member 412 includes a lip 612 that surrounds the outer perimeter of the plate 120 and extends outward past the surface of the plate 120. The lip 612 provides additional protection and electrical isolation to the plate 120 during operation of the saw 100. In particular, the lip 612 prevents contact between the blade 108 and the plate 120 due to potential transient wobbles in the rotation of the blade 108 as the blade 108 cuts work pieces during operation of the saw 100. FIG. 6B further depicts the lip 612 of the support member 412 that extends around the plate 120.

Figure 7:
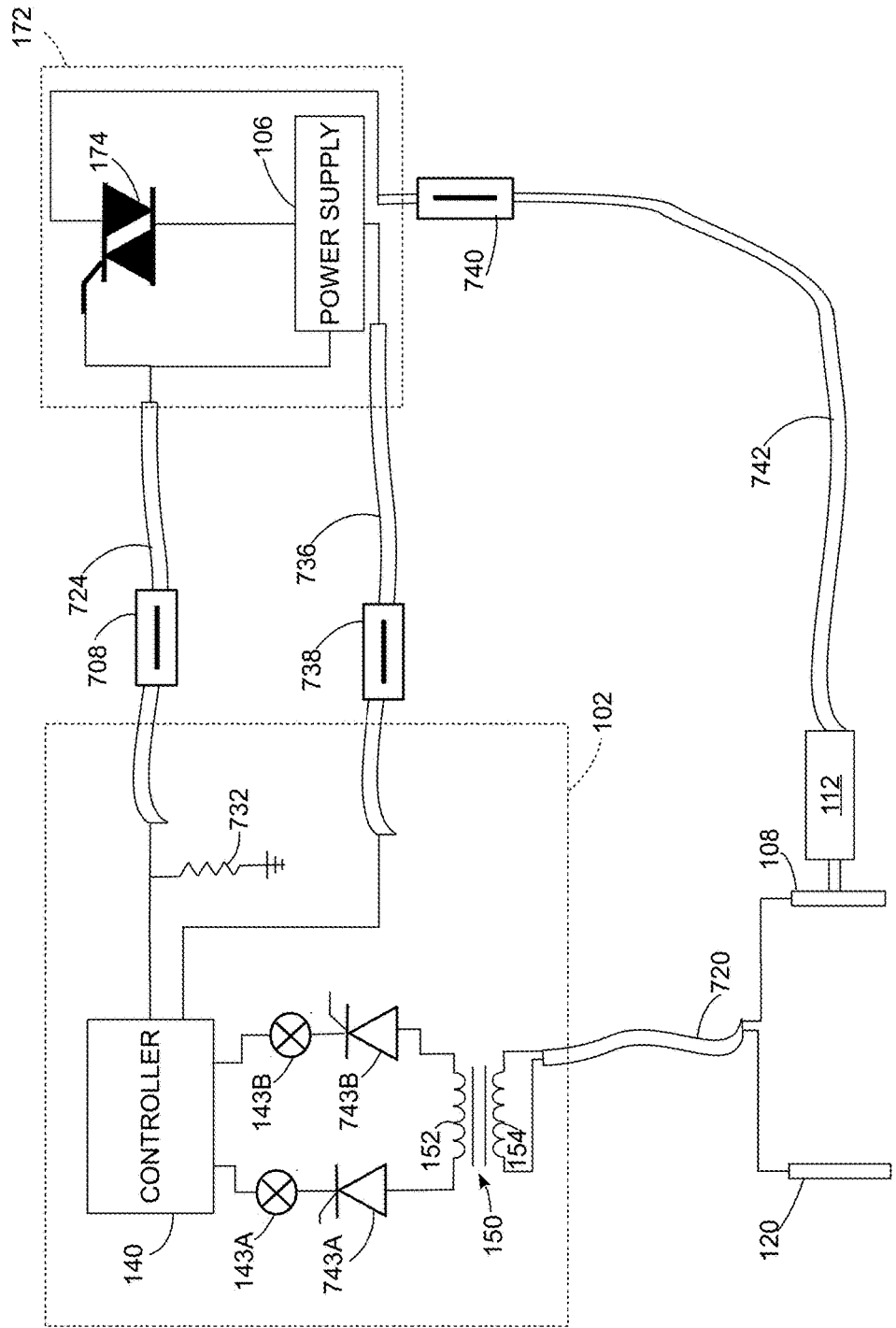
FIG. 7 is a schematic diagram depicting additional details of the object detection system and other components in one embodiment of the saw of FIG. 2.

FIG. 7 depicts additional details of one embodiment of the object detection system 102 and power supply and control PCB 172 of FIG. 2 in more detail. In the configuration of FIG. 7, some of the cables connecting different components in the saw 100 include ferrite chokes, such as ferrite chokes 708, 738, and 740 that are coupled to cables 724, 736, and 742, respectively. The cable 742 connects the TRIAC 174 to the motor 112 and the ferrite choke 740 reduces noise in the electrical current that passes through the cable 742 to supply power to the motor 112 upon activation of the TRIAC 174. As discussed in more detail below, the ferrite chokes 708 and 738 reduce noise in the data and power cables 724 and 736, respectively, which connect the object detection system 102 to the power supply and control PCB 172. In the configuration of FIG. 7, the sensing cable 720 that includes the first conductor connected to the plate 120 and the second conductor electrically connected to the saw blade 108 does not pass through a ferrite choke. Similarly, a motor tachometer cable (not shown) connecting the motor 112 to the controller 140 does not pass through a ferrite choke. As is known in the art, the ferrite chokes filter high-frequency noise from the cables that are connected to the controller 140 and other components in the object detection system.

FIG. 7 also depicts thyristors 743A and 743B. The thyristor 743A connects the third terminal of the transformer 150 to the demodulator 143A for demodulation of the in-phase component of the sensing signal. The thyristor 743B connects the fourth terminal of the transformer 150 to the second demodulator 143B for the quadrature phase component of the sensing signal. The thyristors 743A and 734B are "two lead" thyristors, which are also referred to as Shockley diodes, that switch on in response to an input signal that exceeds a predetermined breakdown voltage but do not require a separate gate control signal to be placed in the switched on state. The thyristors 743A and 743B are configured with a breakdown voltage that is somewhat higher than the normal voltage amplitude of sensing signal to reduce the effects of random noise in the inputs of the demodulators 143A and 143B. However, if an object such as a human hand contacts the blade 108, then the input voltages exceed the breakdown threshold level of the thyristors 743A and 743B and both the thyristors 743A and 743B switch on to enable the spike and the sensing signal to pass to the demodulators 143A and 143B, respectively. The thyristors 743A and 743B are optional components in the embodiment of FIG. 7 and alternative configurations of the object detection system 102 omit these thyristors.

In FIG. 7, the data cable 724 that connects the controller 140 to the power supply 106 and TRIAC 174 on the power supply PCB 172 passes through the ferrite choke 708. Additionally, a pull-down resistor 732 connects the data cable 724 between the controller 140 and the power supply PCB 172 to a local ground (e.g. a copper ground plane on the PCB of the object detection system 102) to provide additional noise reduction in signals that are transmitted over the cable 724. The pull-down resistor and ferrite choke enable the data cable 724 to carry control signals using a predetermined command protocol, such as I²C, over a long distance between the first PCB of the object detection system 102 and the second PCB 172 of the power supply 106 and TRIAC 174. For example, in one configuration of the saw 100, the data cable 724 has a length of approximately 0.75 meters and transmits the I²C signals from the controller 140 to the power supply 108 and command logic associated with the TRIAC 174. The power cable 736 that provides electrical power from the power supply 106 to the controller 140 and other components in the object detection system 102 passes through the ferrite choke 738. While FIG. 7 depicts a separate data cable 724 and power cable 736, in another embodiment a single cable provides both power and data connectivity between power supply PCB 172 and the components in the object detection system 102. The single cable embodiment also uses a ferrite choke to reduce the effects of noise in a similar manner to the configuration of FIG. 7.

Figure 8A:
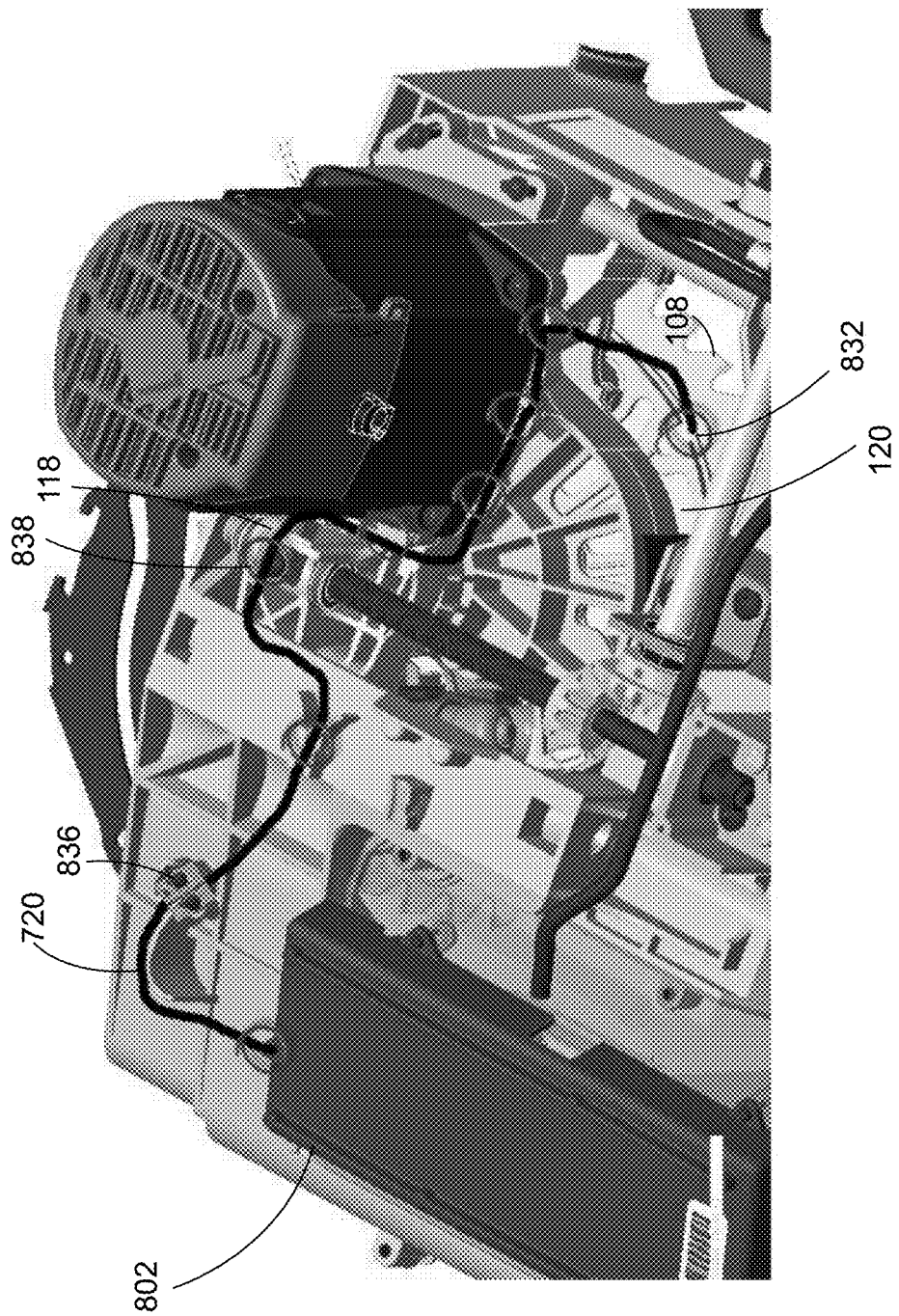
FIG. 8A is a diagram depicting a sensing cable installed in one embodiment of the saw of FIG. 2.
Figure 8C:
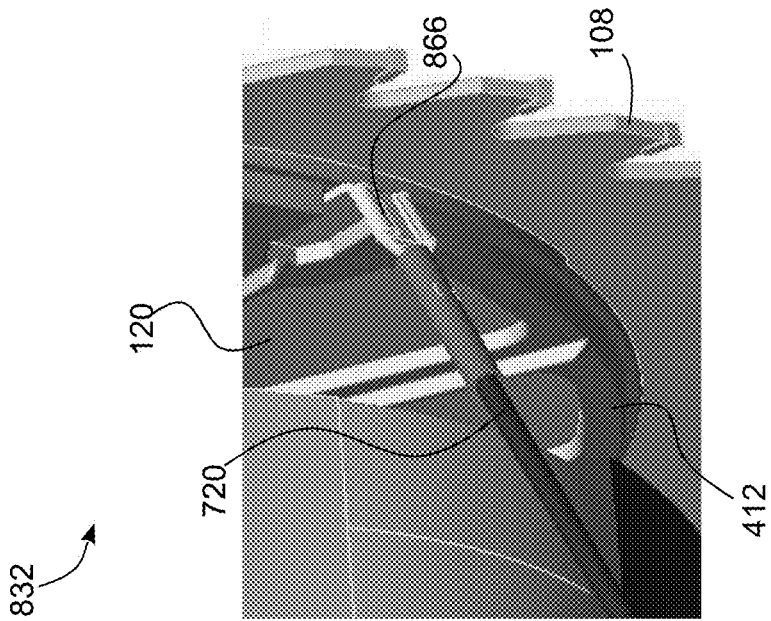
FIG. 8C is a diagram depicting a connection of a first conductor in the sensing cable to a plate in the saw of FIG. 8A.
Figure 8B:
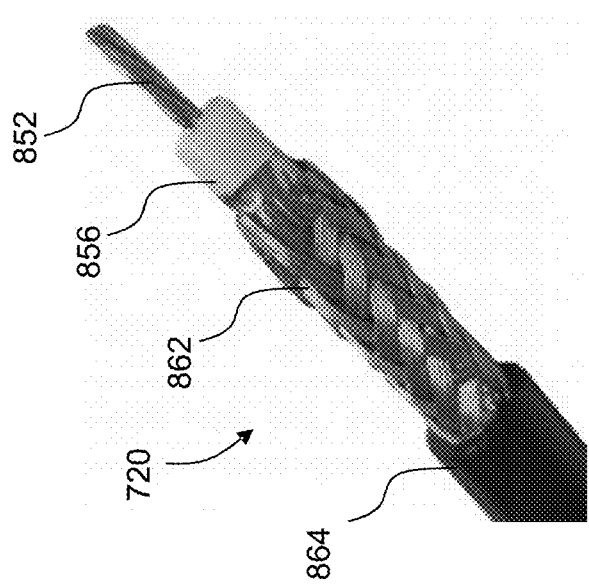
FIG. 8B is a cut away diagram of components in a coaxial sensing cable.

FIG. 8A-FIG. 8E depict the coaxial cable that connects the plate 120 and blade 108 to the detection system 102 in more detail. FIG. 8A depicts an enclosure 802 that contains the PCB and other components in the SCU that implements the object detection system 102 and other control elements of the saw 100. The sensing cable 720 is electrically connected to both the sensing plate 120 and the blade 108. As depicted in FIG. 8A and FIG. 8B the sensing cable 720 is a coaxial cable with a first internal conductor 852, an electrical insulator 856 that surrounds the inner conductor 852 and separates the inner conductors from a second metallic conductor 862, and an exterior insulator 864 surrounding the second conductor 862. In the configuration of FIG. 8A, the first conductor 852 is connected to the plate 120 and to the first terminal of the transformer 150 in the object detection system 102 as depicted in FIG. 2. The second conductor 862 is electrically connected to the blade 108 and to the second terminal of the transformer 150 in the object detection system 102 as depicted in FIG. 2.

While FIG. 8B depicts a coaxial cable, an alternative embodiment employs a twisted pair cable that includes two different conductors that are twisted around one another in a helical pattern. One or both of the conductors in the twisted pair cable are surrounded by an electrical insulator to isolate the conductors from each other. Additionally, a shielded twisted pair cable includes an external shield, such as a metallic foil, that is wrapped around the twisted pair cable and reduces the effects of external electrical noise on the conductors in the twisted pair cable.

FIG. 8A depicts the connection of the single sensing cable 720 to the plate 120 at location 832 and to the bevel carriage and height adjustment carriage of the implement enclosure 118 at locations 836 and 838. FIG. 8C depicts the connection of the first conductor in the sensing cable 720 to the plate 120 at location 832 in more detail. A metal retention clip 866 is affixed to the plate 120 and to the first conductor 852 in the sensing cable 720 to establish the electrical connection. In the configuration of FIG. 8C, the retention clip 866 is inserted between the plate 120 and the support member 412 to ensure a stable connection between the sensing cable 720 and the plate 120. In some embodiments, the retention clip 866 is soldered to the plate 120.

The second conductor 862 is electrically connected to the blade 108, but since the blade 108 rotates during operation of the saw and since the blade 108 is typically a removable component, the second conductor 862 is not physically connected to the blade 108 directly. Instead, the second conductor is connected to the implement enclosure 118. In some saw embodiments, the enclosure 118 actually includes multiple components, such as the height adjustment carriage and bevel carriage in the saw 100. To ensure a consistent electrical connection, the second conductor in the single sensing cable 720 is connected to each of the height adjustment carriage and the bevel carriage to maintain a reliable electrical connection with the blade 108. For example, in FIG. 8 the second conductor in the sensing cable 720 is connected to the height adjustment carriage at location 836 and to the bevel carriage at location 838.

Figure 8E:
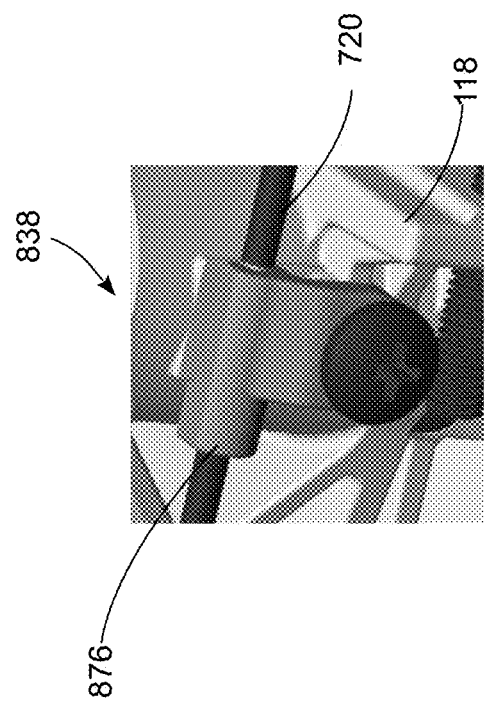
FIG. 8E is a diagram depicting a mount at another location for connection of a second conductor in the sensing cable to an implement enclosure in the saw of FIG. 8A.
Figure 8D:
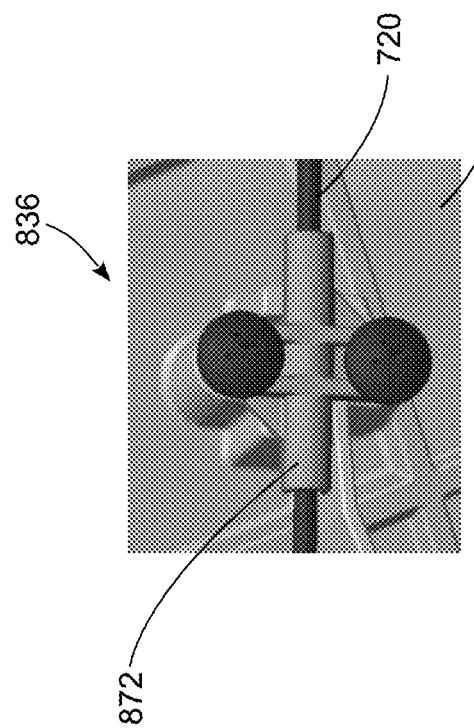
FIG. 8D is a diagram depicting a mount at one location for connection of a second conductor in the sensing cable to an implement enclosure in the saw of FIG. 8A.

FIG. 8D and FIG. 8E depict two different mount locations that connect the second conductor in the sensing cable 720 to the implement enclosure 118 at two different locations including both the height adjustment carriage and bevel carriage. As depicted in FIG. 8D, the second conductor is electrically and physically connected to the implement enclosure 118 at location 836 using a connection mount 872. The outermost insulator 864 is removed from the sensing cable 720 within the connection mount 872 to establish an electrical connection with the implement enclosure 118. In some embodiments, the connection mount 872 is formed from a metal sleeve that surrounds and engages a portion of the second conductor 862 in the sensing cable 720. As described above, the implement enclosure 118 is electrically connected to the arbor 109 and the blade 108, and the cable mount 872 provides a reliable electrical connection between the second conductor 862 in the sensing cable 720 and the blade 108 through the height adjustment carriage. FIG. 8E depicts another configuration of a connection mount 876 that secures the sensing cable 720 at location 838 to the bevel carriage and provides an electrical connection between the second conductor 862 in the sensing cable 720 and the implement enclosure 118. In one embodiment, the connection mount 876 is also formed from a metal sleeve that surrounds a portion of the second conductor in the sensing cable 720 to establish the electrical connection with the blade 108 through the implement enclosure 118.

As depicted in FIG. 2 and FIG. 7, the controller 140 is operatively connected to the power supply 106 and TRIAC 174 on the separate PCB 172 through a data line. In the embodiment of the saw 100, the data line is a multi-conductor cable such as an HDMI cable and the controller 140 transmits command messages to the PCB 172 using the I$^2$C protocol. The controller 140 optionally receives status data or data from sensors, such as onboard temperature sensors, from the PCB 172 using the I$^2$C protocol. The ferrite choke 708 reduces electrical noise in the data cable 724 and the ferrite choke 738 reduces electrical noise in the power cable 736. The tamp resistor 732 also reduces noise through the data cable 724. In one embodiment, the data cable 724 includes a physical configuration that conforms to the High-Definition Multimedia Interface (HDMI) standard, which includes multiple sets of shielded twisted-pair conductors, although the data cable 724 does not transmit video and audio data during operation of the saw 100. In the embodiment of FIG. 2, the data cable has a length of approximately 0.75 meters to connect the separate PCBs 102 and 172.

During operation, the controller 140 signals the TRIAC 174 to supply electrical current to the motor 112 through a gate in the TRIAC. Once triggered, the TRIAC 174 remains activated for as long as at least a predetermined level of electrical current from the power supply 106 passes through the TRIAC 174 to power the motor 112. The power supply 106 varies the amplitude of the current that is delivered to the motor 112 to adjust the rotational speed of the motor 112 and saw blade 108. To deactivate the motor 112, the power supply reduces the level of power supplied to the TRIAC 174 below a predetermined holding current threshold and the TRIAC 174 switches off. In the embodiment of FIG. 2, the TRIAC 174 enables operation of the motor 112 at varying speed levels and activation/deactivation without requiring relays that are typically needed in prior art power saws. In the illustrative example of FIG. 2, the TRIAC 174 passes an AC electrical signal to the motor 112, although alternative embodiments include DC motors that receive DC electrical power instead.

The controller 140 and associated components in the detection system 102 are sometimes referred to as a saw control unit (SCU). The SCU is electrically isolated from other components in the saw 100 with the exception of the power, control, and sensor data connections between the detection system 102 and other components in the saw 100. In the saw 100, the controller 140 also handles control of other operations in the saw 100 that are not directly related to the detection of object contact with the blade 108, such as activating and deactivating the motor 112. In the embodiment of FIG. 2, the SCU is located outside of the implement enclosure 118, the detection system 102 is mounted to a non-conductive plastic support member, and the detection system 102 is oriented to avoid placing the ground plane of the detection system 102 in parallel with any metallic members within the saw 100 to reduce the transfer of electrical noise to the electrically conductive traces in the detection system 102.

In the saw 100, the clock source 144 and driving amplifier 146 in the sensing circuit generate a time varying electrical signal that is directed through a first winding 152 in the transformer 150, the capacitive coupling plate 120, the blade 108, and the implement enclosure 118. The time varying electrical signal is referred to as a "sensing current" because the controller 140 senses contact between the blade 108 and a portion of a human body with reference to changes in the amplitude of the sensing current. The time varying electrical signal is a complex valued signal that includes both an in-phase component and quadrature component. The sensing current passes through the first winding 152 in the transformer 150 to the plate 120. The changes in the first winding caused by discharges between the plate 120 and the blade 108 produce an excitation signal in the second winding 154 of the transformer 150. The excitation signal is another complex valued signal that corresponds to the sensing current passing through the first winding 152.

The controller 140 in the sensing circuit is operatively connected to the motor 112, the second winding 154 in the transformer 150, a mechanical implement reaction mechanism 132. The controller 140 includes one or more digital logic devices including general purpose central processing units (CPUs), microcontrollers, digital signal processors (DSPs), analog to digital converters (ADCs), field programmable gate arrays (FPGAs), application specific integrated circuits (ASICs) and any other digital or analog devices that are suitable for operation of the saw 100. The controller 140 includes a memory 142 that stores programmed instructions for the operation of the controller 140, and data corresponding to a threshold of max-min variations, a variance threshold, or a frequency response threshold that are used to identify if samples obtained from a sensing current flowing through the blade 108 indicate that the saw blade 108 is rotating or is halted.

During operation of the sensing circuit, the clock source 144 generates a time varying signal, such as sinusoidal waveform, at a predetermined frequency. In the embodiment of FIG. 2, the clock source 144 is configured to generate a signal at a frequency of 1.22 MHz, which is known to propagate through the human body. The amplifier 146 generates the sensing current as an amplified version of the signal from the clock source 144 with sufficient amplitude to drive the transformer 150 and capacitor 124 for detection by the controller 140. In the embodiment of FIG. 2, the saw 100 generates the sensing signal using amplitude modulation (AM), but in alternative embodiments the sensing signal is generated with a frequency modulation, phase modulation, or other suitable modulation technique.

During operation of the sensing circuit, the controller 140 receives the in-phase component I of the excitation signal in the second winding 154 through a first demodulator 143A and the quadrature component Q of the excitation signal through a second demodulator 143B. The transformer 150 isolates the sensing current flowing through the first winding 152, plate 120, saw blade 108, and implement enclosure 118 from demodulators 143A and 143B that supply the in-phase and quadrature phase components of the signal, respectively, to the controller 140. Since the demodulators 143A and 143B generate electrical noise, the transformer 150 reduces or eliminates the effects of the noise on the first winding 152 and sensing current. In one configuration, the transformer 150 is a 1:1 transformer where the first winding 152 and second winding 154 have an equal number of turns. In alternative configurations, the ratio of windings in the first winding 152 and second winding 154 are selected to either step-up or step-down the signal for demodulation and monitoring by the controller 140. The controller 140 includes one or more ADCs, filters, and other signal processing devices required to generate digital representations of the amplitude of the in-phase signal I and quadrature signal Q. The controller 140 identifies an amplitude of the sensing current A at a given time as a Pythagorean sum of the in-phase and quadrature components in each sample, as illustrated in the following equation: $A=\sqrt{I^2+Q^2}$. The controller 140 measures the demodulated signal at a predetermined frequency, such as a 100 KHz sampling rate with a 10 μsec period between each sample, to identify changes in the amplitude A of the complex valued signal.

As the motor 112 rotates the blade 108, the rotating blade 108 comes into contact with different objects, including blocks of wood and other work pieces. A small portion of the charge that accumulates on the blade 108 flows into the work piece. The electrical conductivity of the wood work piece is, however, quite low, and the controller 140 in the sensing circuit continues to enable the motor 112 to rotate the saw blade 108. For example, when the blade 108 engages a block of wood, the controller 140 typically measures a small change in the sensing current A, but the change in the sensing current is identified as corresponding to wood or another material with low electrical conductivity.

While work pieces, such as wood, have low electrical conductivity, another object, such as a part of the human body, has a much higher electrical conductivity and absorbs a much greater portion of the charge on the blade 108 as the part approaches the blade 108. In FIG. 2 a portion of a human body 164, such as a hand, finger, or arm, is represented by a charge cloud indicating the flow of charge from the blade 108 to the human body. The contact between the human body and the blade 108 effectively changes the capacitance level, since the human body and saw blade 108 both receive charge from the sensing current. The controller 140 identifies contact between the human body 164 and the blade 108 as a rapid increase in the amplitude A of the sensing current at the time when the human body 164 contacts the blade 108. In response to the rapid increase in the amplitude of the sensing signal, the controller 140 deactivates the motor 112, engages the implement reaction mechanism 132 to halt the motion of the blade 108, and optionally retracts the blade 108 before the blade contacts the human body 164.

In the configuration of FIG. 2, the human body has sufficient conductivity and capacity to draw charge from the blade 108 even when the detection system 102 is isolated from earth ground and when the human body 164 is isolated from earth ground, such as when a human operator wears shoes with rubber soles. Thus, while the detection system 102 and the human 164 do not share a common electrical ground, the controller 140 continues to identify contact between the human 164 and the blade 108 through identification of a rapid increase in the identified sensing current amplitude A. While the absolute value of the amplitude A may vary during operation of the saw 100, the controller 140 can still identify contact with the human 164 in response to the amplitude and time of the increase in the relative value of the amplitude A. During operation of the saw 100, the controller 140 is configured to identify contact with the human 164 and to deactivate the motor 112 and engage the implement reaction mechanism 132 to halt the saw blade 108 in a time period of approximately 1 millisecond.

In the saw 100, the controller 140 deactivates the electrical motor 112 in response to identification of contact between the blade 108 and a portion of a human. In the saw 100, the saw blade 108 generally continues rotating for a period of several seconds due to the momentum that the saw blade 108 accumulates during operation. The implement reaction mechanism 132 is configured to either halt the saw blade 108 in a much shorter period of time, to drop the saw blade 108 below the table 104, which retracts the saw blade 108 from contact with the human, or to both halt and retract the blade 108. In the saw 100, the implement reaction mechanism 132 includes a drop arm that is mechanically connected to the saw blade 108. The implement reaction mechanism 132 also includes a pyrotechnic charge that is configured to push the drop arm down into the housing of the saw and away from the surface of the table 104. The controller 140 operates the pyrotechnic charge to move the drop arm and blade 108 downward in response to detection of contact between a portion of the body of the operator and the blade 108. The implement reaction mechanism retracts the blade 108 below the surface of the table 104.

In some configurations of the saw 100, the controller 140 is configured to lock out operation of the saw 100 after the pyrotechnic device is fired a predetermined number of times. For example, in the configuration of the saw 100 the implement reaction mechanism 132 includes a dual-pyrotechnic charge with a total of two "shots". Each operation of the implement reaction mechanism consumes one pyrotechnic charge a in a "monoshot" operation. The operator removes and re-inserts the pyrotechnic device to place the second pyrotechnic charge in position to move the drop arm in a subsequent operation of the implement reaction mechanism 132. The controller 140 stores a record of the number of activations of the implement reaction mechanism 132 and prevents the saw 100 from being activated in a lockout process after the number of activations exceeds a predetermined number, such as one, two, or a larger number of activations. The controller 140 optionally sends a network notification to a service or warranty provider in embodiments of the saw 100 that are connected to a data network, such as the Internet, in the lockout operation. The lockout process enables service providers to diagnose potential issues with the operation of the saw 100 or procedures for use of the saw 100 in response to operation of the implement reaction mechanism 132 on a frequent basis.

In addition to sensing contact between an object and the saw blade 108 when the saw blade 108 is moving, the sensing circuit in the saw 100 is configured to identify if the saw blade 108 is moving when the motor 112 is deactivated. For example, the controller 140 identifies a period of time when the saw blade 108 continues to rotate after an operator operates the user interface 110 to activate the saw 100 to cut one or more work pieces, and subsequently opens the operates the user interface 110 to deactivate the motor 112. The user interface 110 includes, for example, an activation/deactivation switch to operate the saw 100, a speed control input device, and status indicator lights that provide information about the operational status of the saw 100, such as if the saw is ready for operation or has developed a fault. The user interface device 110 is also referred to as a human machine interface (HMI).

The saw 100 is configured to be operated with the blade 108 and blade arbor 109 being isolated from electrical ground. The control electronics on the boards 102 and 172, the plate 120 and the implement enclosure 118 may not be connected to a true earth ground in some configurations, but these components share a common ground plane formed by, for example, a metal chassis of the saw or a ground plane formed on the circuit boards of 102 and 172. As described above, during the contact detection process the controller 140 identifies a spike in the current level for the sensing signal. However, electrical noise that is generated within the saw 100 could produce false positive or false negative detection events since noise interferes with detection of the sensing signal. In the saw 100, the PCBs 102 and 172 include ferrite core chokes that act as low-pass filters to reduce the effects of noise. Additionally, the power cabling and data cabling pass through ferrite cores to reduce the noise. The power supply 106 includes a ferrite choke and a thyristor to reject low-speed transient noise in the electrical power signal that is received from the electrical power grid, a generator, or other electrical power source.

Figure 5B:
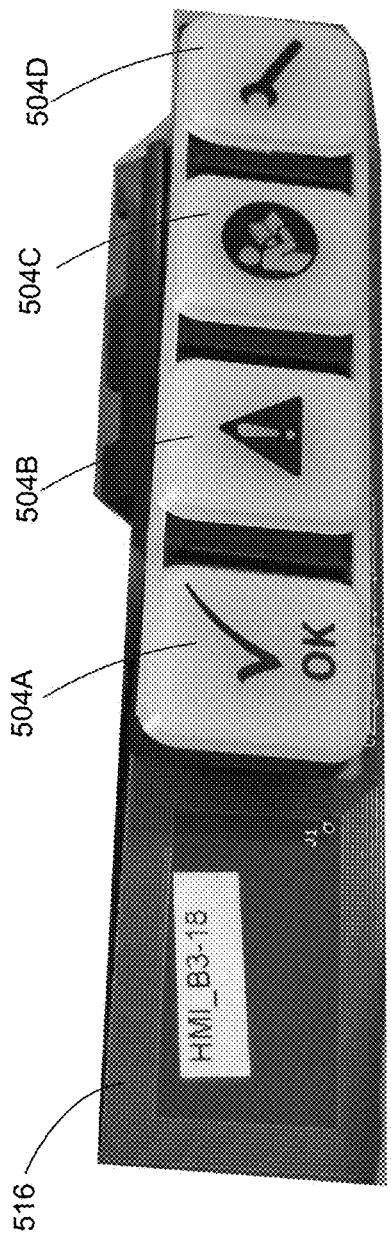
FIG. 5B is a view of the user interface device of FIG. 5A with an external housing removed.

FIG. 5A-FIG. 5D depict a portion of one embodiment of the user interface device 110 in more detail. FIG. 5A depicts an exterior view of a device status display including an external housing 502, indicator lights 528A-528D, and a covering for a short-range antenna 508. During operation, the controller 140 activates one or more of the lights 528A-528D to indicate different status information about the saw 100. For example, the light 528A indicates that the saw 100 is ready for operation. The light 528B indicates that the implement reaction mechanism 132 has operated and that the pyrotechnic charge in the implement reaction mechanism 132 should be reset. The light 528C indicates that the user should look up a fault code. The light 528D indicates that the saw 100 requires maintenance to replace a component in the saw, such as a motor brush, or that the saw 100 requires maintenance after the implement reaction mechanism has operated for more than a predetermined number of times. As depicted in FIG. 5A, the indicator lights 528A-528D provide a simplified interface. Alternative embodiments include a different arrangement of indicator lights or include additional input and output devices including, for example, video display screens, touch input devices, and the like.

While the display indicator lights 528A-528D provide simplified direct output feedback to the operator for regular use with the saw 100, in some circumstances the saw 100 transmits more complex diagnostic and configuration data to external devices. The controller 140 and user interface device 110 optionally transmit more complex diagnostic data and other information about the saw 100 to an external computing device via the short-range wireless antenna under the cover 512. Examples of diagnostic data that the controller 140 collects and optionally transmits with the wireless transceiver and antenna 516 include, presence of voltage in the sensing circuit, the level of the sensor signal, status information to indicate if the pyrotechnic device (pyro) in the implement reaction mechanism 132 is armed or disarmed, generate a test signal for the pyro firing line without sending a signal with sufficient amplitude to trigger monoshot operation of the pyro, detect presence or absence of the pyro, check a resistance range for corrosion or wire damage in the sensor cable connected to the plate 120 and implement enclosure 118 or other cables in the saw 100, generate a "tackle pulse" to identify a wire break in the line that provides power to the motor 112, and identify faults in the motor 112 during a power on self-test.

Figure 5C:
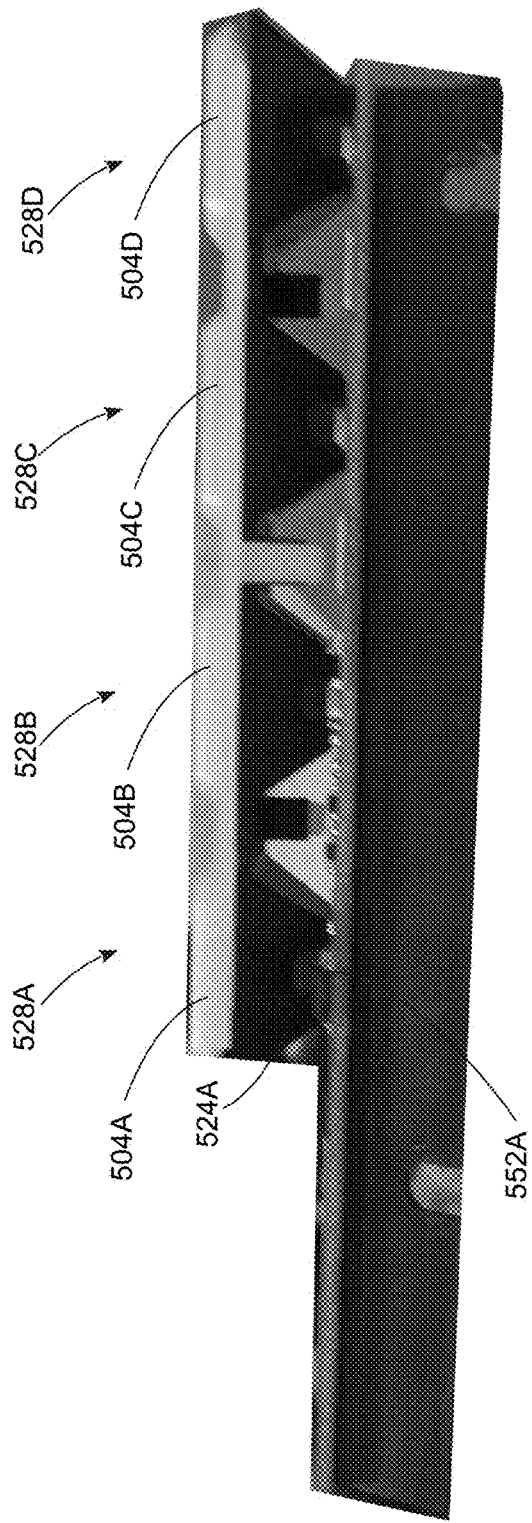
FIG. 5C is a profile view of the user interface device of FIG. 5B.

As depicted in FIG. 5B, the short-range wireless antenna 516 is formed from a predetermined arrangement of conductive traces on a PCB that supports the indicator lights 528A-528D. FIG. 5B and FIG. 5C depict optically translucent caps 504A-504D that form the exterior visible surface of each of the lights 528A-528B, respectively. The external housing 502 protects the antenna 516 from external elements while enabling the antenna to be located on the exterior of the saw 100 to communicate with external electronic devices. The antenna 516 is operatively connected to a wireless transceiver, such as an NFC, Bluetooth, IEEE 802.11 protocol family compatible ("Wi-Fi"), or other suitable short-range wireless transceiver. An external electronic device, such as a smartphone, tablet, portable notebook computer, or other mobile electronic device receives data from the saw via a wireless communication channel and optionally transmits information to the saw 100 using the wireless communication channel. For example, a smartphone receives diagnostic data from the saw 100 and a software application that is run on the smartphone displays detailed diagnostic information to an operator or maintenance technician to assist in maintenance of the saw 100. The software application optionally enables the operator to input configuration information for operational parameters of the saw 100 that are not directly accessible through the simplified input device 110. For example, in one configuration the software application enables the operator to input a maximum RPM rate for the motor 112 and blade 108. In another configuration, the software application enables the operator to transmit an identifier for a type of material that the saw 100 will cut during operation, such as different types of wood, ceramics, plastics, and the like.

In another configuration, the saw 100 includes a lockout mechanism to prevent operation of the saw 100 unless a mobile electronic device with an appropriate cryptographic key is within a predetermined distance of the saw 100. The mobile electronic device transmits an encrypted authorization code to the saw 100 in response to a query from the saw 100 to unlock the saw 100 for operation. When the mobile electronic device is removed from proximity from the saw 100, a subsequent query fails and the saw 100 remains inactive.

FIG. 5C depicts a profile view of the indicator lights 528A-528D. Each light includes an optically translucent cap, such as the cap 504A on the light 528A, and an optically opaque body member 524A directs light from a light source, such as an LED, to the translucent cap. In the indicator light 528A, an LED 552 that is mounted on the PCB projects light through an opening in the opaque body member 524A and the translucent cap 504A. The opaque body member 524A has a tapered shape with a narrow end surrounding a first opening for the LED 552A and a wider end with a second opening that engages the translucent cap 504A. The optically opaque member 524A prevents the light from the LED 552A from bleeding and producing false illumination in any of the other indicator lights 528B-528D. The configuration of FIG. 5C enables the indicator lights in the user interface device 110 to operate in direct daylight conditions and prevents false illumination of incorrect indicator lights during operation.

Figure 5D:
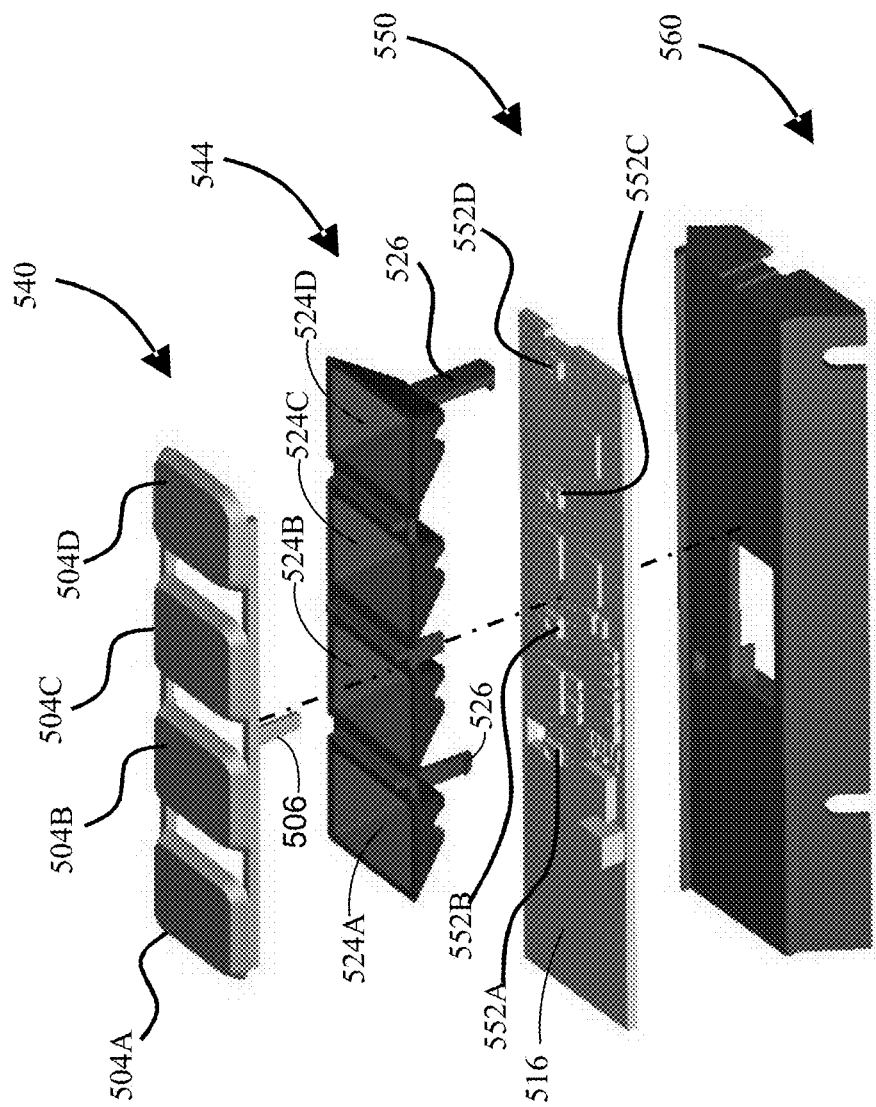
FIG. 5D is an exploded view of components in the user interface of FIG. 5A-FIG. 5C.

FIG. 5D depicts an exploded view of select components from FIG. 5A-FIG. 5C. FIG. 5D depicts the indicator cap assembly 540, which is formed from a molded plastic member that includes the translucent indicator light caps 504A-504D for the lights 528A-528D. The indicator cap assembly 540 also includes an attachment member, such as the hook 506 that is formed from the molded plastic member of the indicator cap assembly 540, to secure the caps to other components in the user interface device 110. The body member assembly 544 is another molded plastic member that includes the optically opaque body members 524A-524D corresponding to the caps 504A-504D. Each of the optically opaque body members 524A-524D includes a first opening that aligns with one of the LEDs 552A-552D and a second opening that engages one of the caps 504A-504D. The body member assembly 544 also includes attachment members, such as the hooks 526, which connect the opaque body members to other components in the user interface device 110. The PCB 550 includes physical mounting locations and electrical connections for the operation of the user interface device 110. In particular, FIG. 5D depicts light emitting diodes (LEDs) 552A-552D that are aligned with first openings in the corresponding opaque members 524A-524D and that provide light for the caps 504A-504D of the indicator lights 528A-528D. The PCB 550 also includes the antenna 516, which is formed from a predetermined pattern of conductive traces on the PCB, to enable wireless communication with the user interface device 110. In some embodiments, the PCB 550 also supports a wireless transceiver directly, while in other embodiments the wireless transceiver is integrated with the controller 140. The indicator cap assembly 540, body member assembly 544 and PCB 550 are mounted to a base member 560, which is a molded plastic member in the embodiment of FIG. 5D. The base member 560 secures the components of the user interface device 110 to the exterior housing of the saw 100.

FIG. 3 depicts the user interface device 110 mounted on the exterior of the housing of the saw 100. The base member 560 attaches the components in the user interface device 110 to the exterior of the housing in the saw 100 where the indicator lights 528A-528D are easily visible to the end user. Furthermore, the antenna 516 on the PCB 550 is positioned outside of the electrical shielding of the saw 100, which provides both a clear view to enable communication with short-range external wireless devices and isolates the antenna 516 and any wireless transceivers on the PCB 550 from sources of electrical noise within the saw 100. A data cable (not shown) connects the controller 140 mounted on the PCB within the housing of the saw 100 to the user interface device 110 on the exterior of the saw.

While the user interface device 110 depicted above includes lights and a wireless data interface, in some configurations the saw 100 includes additional data interface devices. For example, in one embodiment a universal serial bus (USB) or other suitable wired data connector is operatively connected to the controller 140. The saw 100 includes a USB port near the rear of the bevel carriage. The USB port is hidden from ordinary operators, but maintenance personnel access the USB port by moving the bevel carriage to either the left or right extreme tilt position and locating the USB port through an opening at the back of the housing of the saw 100. The USB port is connected to an external computing device to perform diagnostic and maintenance operations. The USB connection also enables maintenance personnel to update stored software programs in the memory 142 that the controller 140 executes during operation of the saw 100.

Referring again to the saw configuration of FIG. 2, in one operating mode the controller 140 in the saw 100 employs an adaptive thresholding process to identify the current spikes that correspond to the contact between an operator and the blade 108 to control operation of the implement reaction mechanism 132. During the adaptive threshold process, the controller 140 identifies an average signal level for the sensing signal over a predetermined period of time (e.g. 32 sampling periods that last 320 μsec at a sampling rate of 100 KHz). The controller 140 applies a predetermined bias value to the detected average level and uses the sum of the average and the bias level as an adaptive threshold. The controller 140 updates the average threshold based on comparatively small changes in the average level of the sensing signal that occur due to electrical noise, which prevents detection of a false positive contact event when the level of the sensing signal only changes due to electrical noise in the sensing signal. If contact between the operator and the blade 108 occurs, the rapid spike in the sensing current exceeds the predetermined bias level and the controller 140 detects the contact and activates the implement reaction mechanism 132.

In an optional embodiment of the adaptive threshold detection process, the controller 140 also identifies the signal to noise ratio (SNR) in the sensing signal in response to detecting a spike in the sensing signal current to further reduce the likelihood of false positive detection. The controller 140 identifies the SNR with reference to a mean value of the signal over a predetermined time window divided by the variance of the signal level over the same time window. In one configuration, the controller 140 performs a block computation process to reduce the computational complexity of identifying the SNR, which enable the controller 140 to identify the SNR within the operational timing constraints for operation of the implement reaction mechanism 132. In the block computation process, the controller 140 identifies the mean values of the signal over comparatively short blocks (e.g. 32 sampling periods that last 320 μsec at a sampling rate of 100 KHz) and stores the computed block mean values in a memory. The controller 140 then identifies the SNR over a series of the blocks, such as eight consecutive blocks of time over a period of 2560 μsec in one embodiment.

The controller 140 identifies a single variance value for all of the blocks based on the difference between the eight "local" mean values that occur in each of the eight blocks and a single "global" average mean value for all eight blocks. The controller 140 identifies the SNR based on only the eight mean values an d the identified variance value of instead of identifying the mean and variance over a total of 256 separate samples. The block computation process greatly reduces the computational power that is required to identify the SNR. The controller 140 continues identification of additional samples over time and updates the SNR sample after the oldest block is removed from the set of eight blocks to accommodate newer samples during operation. After identification of the SNR, the controller 140 identifies if the SNR level is below a predetermined minimum threshold at the time of detecting a sensing current spike that exceeds the detection threshold for contact between the operator and the blade 108. If the SNR level is too low, which indicates a weak signal level in comparison to the detected noise level, then the controller 140 does not operate the implement reaction mechanism 132 to prevent false positive operation when the operator is not actually in contact with the blade 108.

Another optional configuration of the adaptive thresholding process includes an operation to detect static discharge from the blade 108 and prevent a static discharge event from being incorrectly identified as contact between the operator and the blade 108. During operation of the saw 100, the rotating blade may accumulate static and discharge the static to components within the saw 100 or to an external object such as a work piece. The static discharge often produces a momentary positive or negative voltage spike in the sensing signal that is similar to the spike that occurs in response to contact between the operator and the blade 108. However, the amplitude of the spike due to static discharge is often several times larger than any spike that is generated due to contact with the operator. Consequently, in some embodiments the controller 140 identifies human contact not only in response to the amplitude of the sensing signal exceeding the adaptive threshold, but also in response to the amplitude of the spike being below an upper bound threshold that is higher than the initial detection threshold to avoid a false-positive operation of the implement reaction mechanism 132 in response to a static discharge event.

The adaptive thresholding process is useful in multiple operating modes of the saw 100 including operating modes in which the saw 100 performs "DADO" cuts. As is known to the art, during a DADO cut operation the blade 108 cuts a trench through all or a portion of a work piece, but does not completely cut the work piece into two separate parts. Many DADO cuts produce trenches that are thicker than a single saw blade, and the saw 100 operates with multiple saw blades placed together on the arbor 109 to form the thicker trenches. The multiple saw blades act as an antenna and receive electrical noise from various sources inside and outside of the saw 100, which reduces the signal to noise ratio during DADO cuts.

In some embodiments, the controller 140 also detects contact between the operator and the blade 108 over a longer period of time during DADO cutting operations to account for the increased noise levels that are present in the detection signal. For example, in one configuration the controller 140 identifies a spike in the current level that exceeds the adaptive threshold for contact detection in a first sample period. In a high-noise environment, a noise spike may also produce the large spike that exceeds the adaptive threshold level. However, a true contact event produces a relatively consistent spike in the current that remains above the threshold for several sampling periods (e.g. up to 10 periods at a sampling rate of 100 KHz). The controller 140 identifies the change in the spike level over multiple sampling periods. If the amplitude of the spike remains high and does not change level by a large amount over several sampling periods, then the controller 140 identifies that the blade 108 is in contact with the operator and activates the implement reaction mechanism 132. If, however, the controller 140 identifies large variations in the level of the sensing current spike, then the controller 140 identifies that the changes in the sensing current are due to noise and does not operate the implement reaction mechanism 132. Even with the longer detection period, the total detection and operation time of the object detection system 102 occurs within a period of only a few milliseconds to maintain the effectiveness of the implement reaction mechanism 132.

The adaptive thresholding process improves the accuracy of contact detection during the DADO cut. However, the adaptive thresholding process is not strictly required for use during DADO cut procedures, and the adaptive thresholding process is also effective for use in other modes of operation of the saw 100.

During operation of the saw 100, the controller 140 optionally performs a fault detection process to identify faults in the cable that connects the sensor plate 120 or implement enclosure 118 to the detection system 102. The controller 140 identifies hard faults, such as full breaks in the cable, via a continuity test. So-called "soft faults" occur when the cable is at least intermittently connected, but the quality of the connection does not enable the sensing signal to reach the sensor plate 120 and for the controller 140 to detect the sensing current through the capacitor 124. In one configuration, the controller 140 identifies soft faults prior to activation of the motor 112. The controller 140 generates the sensing current through the sensing cable while the motor 112 remains deactivated and the level of electrical noise in the saw 100 is relatively low. If the amplitude or noise levels of the sensing signal deviate from expected values by more than a predetermined operational tolerance threshold, then the controller 140 identifies a soft fault in the sensing cable. The controller 140 produces an error signal through the user interface device 110 and prevents activation of the motor 112 in response to detection of hard or soft faults in the sensing cable until the sensing cable is repaired or replaced.

In some embodiments, the saw 100 characterizes the capacitance levels of different operators through contact with a capacitive sensor at a predetermined contact location in the saw. For example, in one embodiment the saw 100 includes a metal handle that registers the capacitance, conductance, and other electrical properties of the hand of an operator when the operator grips the handle. In other embodiments, a capacitive sensor is located in a rail or other surface of the saw 100 that an operator contacts during typical operation of the saw 100. The controller 140 receives sensor data corresponding to the electrical properties of each operator and adjusts the blade contact detection thresholds and other operating parameters to improve the accuracy of blade contact detection for each operator.

In some embodiments, the saw 100 performs pattern detection with the sensing signal to identify the state of the blade 108 during operation. For example, in one embodiment the controller 140 identifies elements of the sensing signal that correspond to tooth strikes between the blade 108 and a work piece. The controller 140 optionally uses a tachometer or other RPM sensor to identify the rotational rate of the blade 108, and the controller 140 receives data corresponding to the size and number of teeth on the blade 108 to identify an expected frequency of tooth strikes as the blade 108 engages the work piece. The controller 140 uses the expected tooth strike frequency to assist in identification of sensing signals that may correspond to contact between the operator and the blade 108 or that merely corresponding to electrical noise that is produced when a tooth strikes the work piece.

In some embodiments of the saw 100, the controller 140 stores identified profiles of the sensing signal while the saw 100 cuts different types of material. For example, the saw 100 cuts through different varieties of wood or pieces of wood with varying moisture levels to identify the amplitude and noise levels for the sensing signal that are detected while cutting a plurality of different types of wood or other material. The profile generation process optionally occurs at a factory prior to shipment of the saw 100. During subsequent operation, the operator provides input to characterize the type of material that the saw 100 will cut, and the controller 140 retrieves a stored profile of the expected sensing signal parameters from a memory to assist in identification of the expected sensing signal when cutting the work piece.

Figure 9A:
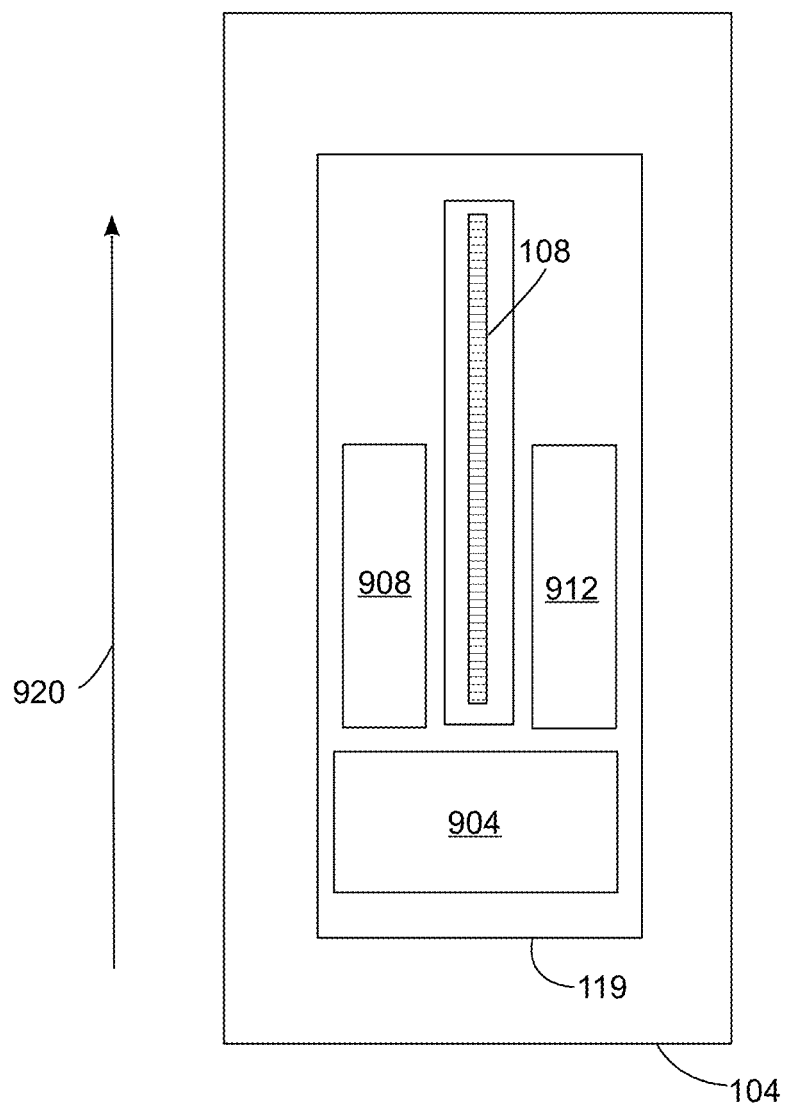
FIG. 9A is a schematic diagram of capacitive sensors arranged in a throat plate around a blade in one embodiment of the saw of FIG. 2.

FIG. 9A depicts another embodiment of an object detection sensors that is suitable for use in conjunction with the object detection system 102 in the saw 100 or in another saw embodiment. In FIG. 9A, the throat plate 119 incorporates capacitive sensors 904, 908, and 912. Each of the sensors 904, 908, and 912 are capacitive sensors that can detect the presence of a human hand or other body part either in contact or close proximity to the surface of the corresponding capacitive sensor due to a change in capacitance around the sensor. By contrast, a work piece such as wood produces a much different change in capacitance to enable a controller, such as the controller 140 depicted in FIG. 2, to distinguish the work piece from a human body part. The capacitive sensors 904-912 are arranged along the cut direction 920, which corresponds to the direction that a work piece travels as the blade 108 cuts the work piece. The capacitive sensor 904 is arranged in an area across the front of the saw blade 108. The capacitive sensors 908 and 912 are arranged conformal to the saw blade 108 on the left and right hand sides, respectively, as viewed from the front of the saw blade 108.

As depicted in FIG. 9A, each of the capacitive sensors 904-912 occupies a predetermined region of the throat plate 119, such as the rectangular regions depicted in FIG. 9A or another geometric shape. In some embodiments, the capacitive sensors 904-912 detect not only the presence of a human body part proximate to the corresponding sensor, but also a location of the human body part over the surface of the sensor and a velocity and direction of movement of the human body part over time. The thermoplastic throat plate 119 isolates the capacitive sensors 904-912 from the blade 108, the surface of the table 104, and from other components within the saw.

Figure 9B:
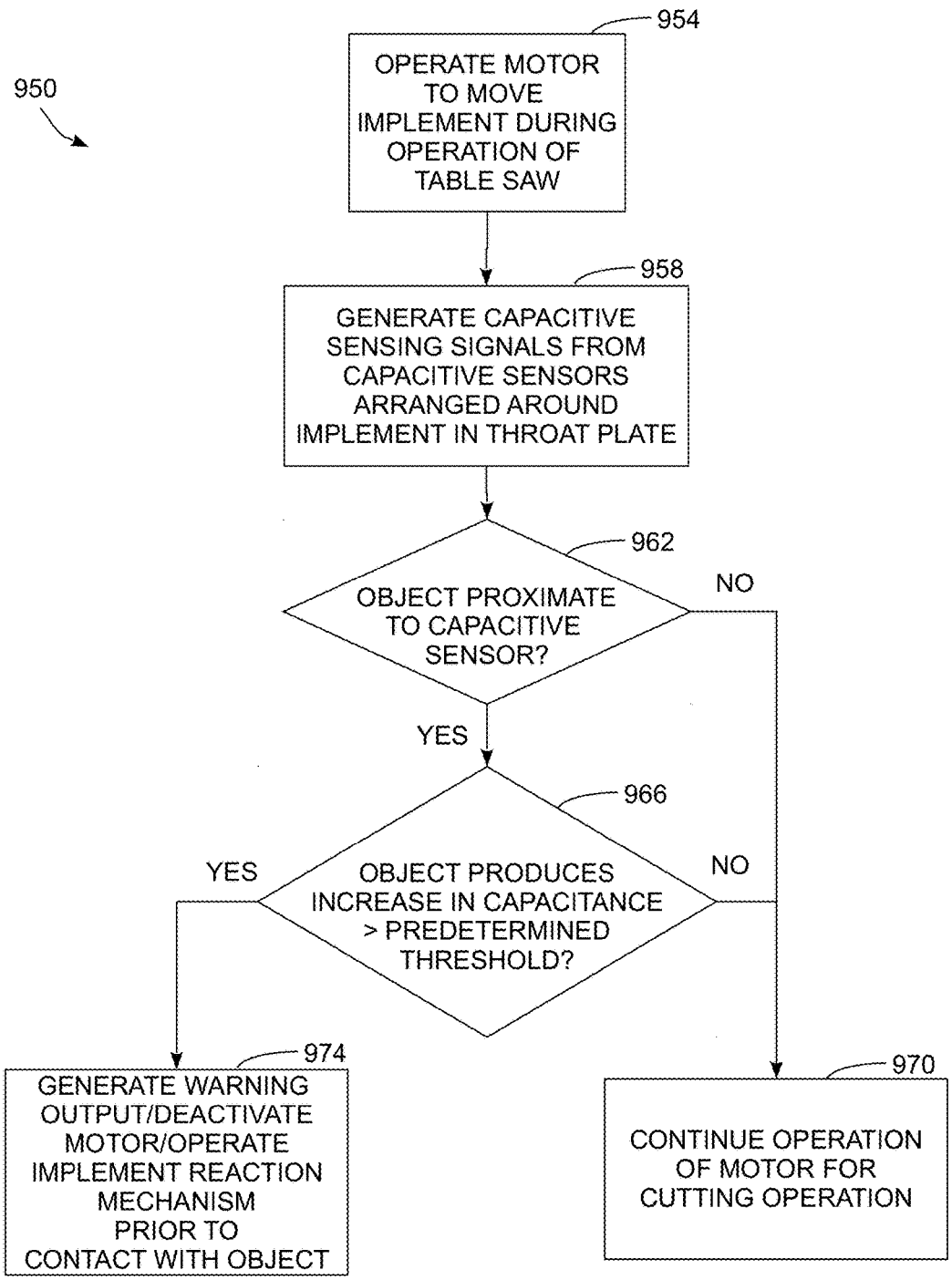
FIG. 9B is a block diagram of a process for operation of a table saw using the capacitive sensors of FIG. 9A.

FIG. 9B depicts a process 950 for operation of the capacitive sensors 904-912 in the saw 100. In the description below, a reference to the process 950 performing a function or action refers to an operation of a controller to execute stored program instructions in association with other components in the saw to perform the function or action. The process 950 is described in conjunction with the embodiment of FIG. 9A and the saw 100 for illustrative purposes.

Process 950 begins as the saw 100 is activated and the motor 112 moves the blade 108 to cut work pieces (block 954). During operation, the capacitive sensors 904-912 generate the capacitive sensing signals to detect the presence of objects that are proximate to the surfaces of the capacitive sensors 904-912 in the throat plate 119 around the blade 108 (block 958).

If the controller 140 identifies a change in the capacitance level of one or more of the capacitive sensors 904-912 based on a change in an RC time constant of the capacitive sensing signal, then the controller 140 detect the presence of an object, such as a work piece or human body part, in the region around the saw blade 108 prior to contact between the object and the saw blade (block 962). For example, in some embodiments, the capacitive sensors 904-912 include capacitive sensing elements that form one plate in a capacitor and an electrically non-conductive dielectric that covers the capacitive sensing element and covers the surface of the capacitive sensors 904-912. An oscillator in the capacitive sensors generates a time-varying capacitive sensing signal using an RC circuit formed from the capacitive element in each sensor and a predetermined resistor. As is known in the art, the RC time constant changes in response to a change in the size of the capacitance C in the RC circuit, and the capacitive sensor or an external control device identifies contact with objects based on changes in the time-varying signal. An object positioned over the surface one of the sensors 904-912 acts as the second plate in a capacitor and produces a change in the capacitance level of the sensor.

If the controller 140 identifies that there is no object proximate to the capacitive sensors (block 962) or that a detected object produces a minimal change in capacitance that corresponds to a work piece but not a human body part (block 966) then the saw 100 continues operation to cut a work piece (block 970). Electrically conductive objects, such as a finger or other body part of a human operator, produce comparatively large changes in capacitance while electrically nonconductive objects, such a wood work pieces, produce small changes in the capacitance level. As described above, the characteristics of a work piece such as wood generate a change in capacitance in the sensors 904-912 that is sufficiently distinct from a human body part to enable the controller 140 to distinguish between the work piece and a human body part that is in close proximity to the capacitive sensors 904-912.

During process 950, if the capacitive sensors generate a signal corresponding to a sufficiently large change in capacitance that corresponds to the presence of a hand or other body part in close proximity to the capacitive sensors 904-912, then the controller 140 generates a warning output, deactivates the motor 112, or activates the implement reaction mechanism 132 prior to the object contacting the blade 108 (block 974). In a configuration where the detected object has not actually touched the blade but has moved within a predetermined distance of the blade, the controller 140 deactivates the motor 112 to enable the saw blade 108 to come to a halt but does not engage the implement reaction mechanism 132 unless the object actually contacts the blade as detected using the object detection system 102 described above. In other embodiments, if the capacitive sensors 904-912 detect an object corresponding to a human body part, the controller 140 generates a warning signal, such as a light that is visible to the operator on the table 104, for the operator prior to deactivating the motor 112 or operating the implement reaction mechanism 132. In some embodiments the object detection system 102 operates the implement reaction mechanism 132 if the object contacts the blade 108 prior to the blade 108 coming to a complete halt or prior to the object coming into contact with the blade 108.

In some embodiments of the process 950, the capacitive touch sensors 904-912 each include a two-dimensional grid of sensing elements that enable the touch sensors to generate multiple capacitive detection signals corresponding to the position within the two-dimensional region covered by each of the capacitive sensors. In some configurations, the controller 140 generates a warning signal if a human body part object is detected at a first position that is over one of the sensors 904-912 but beyond a first predetermined distance from the blade 108 and then deactivates the motor 112 if the object moves with the predetermined distance of the blade 108. Furthermore, the controller 140 or other control device identifies a path of movement and velocity of the object based on a series of object locations that the individual sensing elements in the capacitive sensors 904-912 generate over time. If the path of movement indicates that an object, such as a human hand, has a high likelihood of contacting the blade 108 at some point along the path, then the controller 140 deactivates the motor 112 or generates the warning output as described above. Additionally, in some configurations the controller 140 activates the implement reaction mechanism 132 to retract the blade 108 or other implement prior to actual contact between the hand or other body part of the operator. For example, if the detected location of a hand of the operator is within a predetermined distance of the blade 108 or the path of movement of the hand over the capacitive sensors has a trajectory that could with the blade 108, then the controller 140 optionally activates the implement reaction mechanism 132 before the contact with the blade 108 actually occurs. Of course, the capacitive sensors 904-912 and the process 950 can be implemented in tandem with the operation of the object detection system 102 that is described above to detect the presence of a body part of the operator in proximity to the blade 108 and to detect actual contact between the body part and the blade 108.

In addition to the operation of the object detection system 102 that is described above, the saw 100 is further configured to perform different configuration and diagnostic processes to maintain reliability and enable operation of the saw with a wide range of different materials. For example, the saw 100 is configured to maintain a record of the number of times that the implement reaction mechanism has been activated to ensure that the saw 100 receives proper maintenance.

Figure 10:
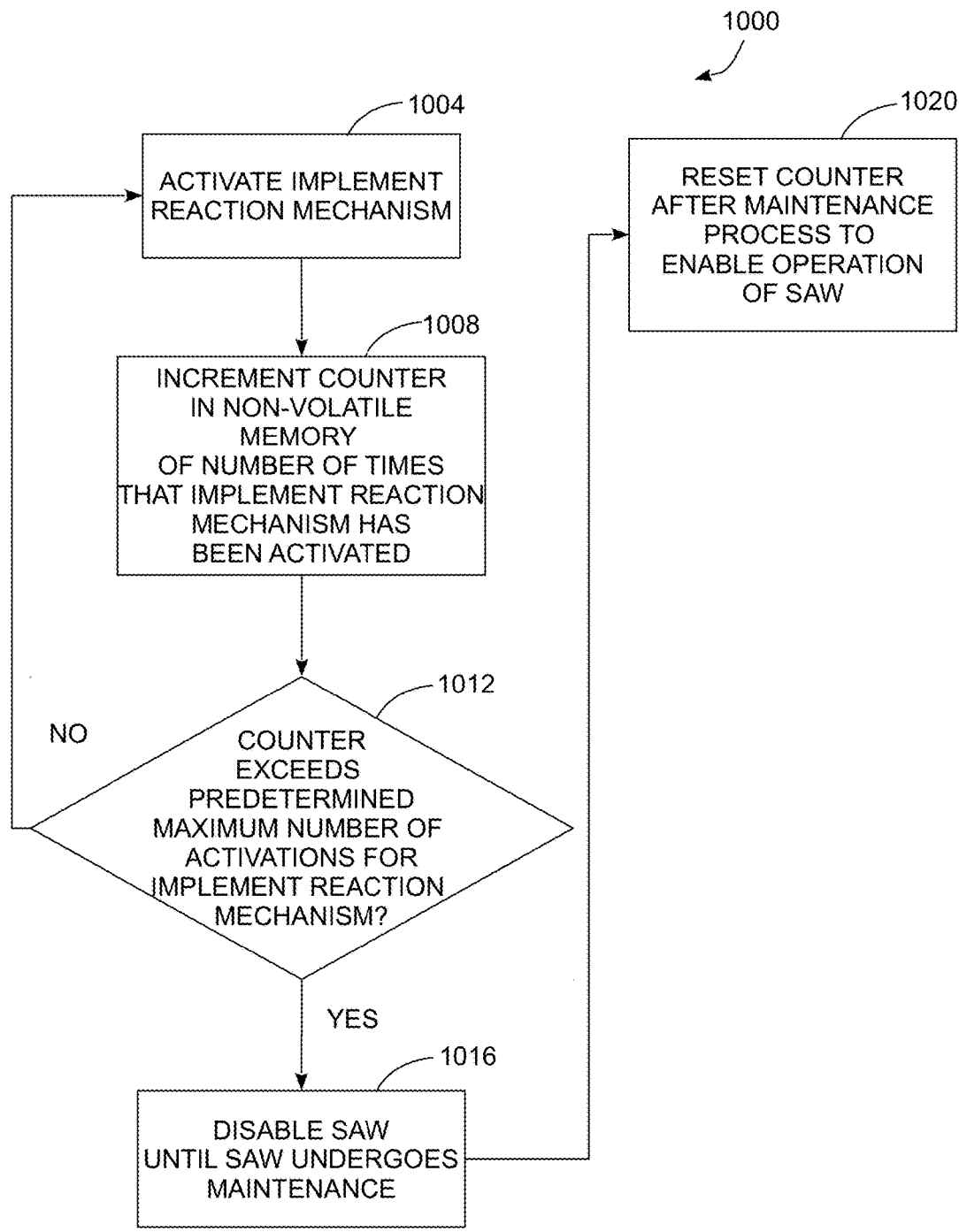
FIG. 10 is a block diagram of a process for monitoring activity of the implement reaction mechanism in one embodiment of the saw of FIG. 2 and disabling the saw for maintenance after the number of activations of the implement reaction mechanism exceeds a predetermined number.

FIG. 10 is a block diagram of a process 1000 for monitoring the operation of the implement reaction mechanism in the saw. In the discussion below, a reference to the process 1000 performing a function or action refers to the operation of a controller to execute stored program instructions to perform the function or action in association with one or more components in the saw. The process 1000 is described in conjunction with the saw 100 for illustrative purposes.

Process 1000 begins upon activation of the implement reaction mechanism (block 1004). In the saw 100, the controller 100 activates the implement reaction mechanism 132 in response to detection of contact between an object, such as the hand of the operator, other than a work piece. In one embodiment of the saw 100, a pyrotechnic charge in the implement reaction mechanism 132 fires to retract the blade 108 below the level of the table 104. The controller 140 increments a counter held in a non-volatile portion of the memory 142 to maintain a record of the number of times that the implement reaction mechanism has been activated during operation of the saw 100 (block 1008). As is known to the art, the non-volatile memory, such as a solid-state or magnetic data storage device, retains stored data over a long period of time even when the saw 100 is deactivated and disconnected from electrical power.

The process 1000 and the operation of the saw 100 continues while the total number of activations of the implement reaction mechanism 132 remains below a predetermined threshold (e.g. five activations of the implement reaction mechanism 132) (block 1012). If the number of activations of the implement reaction mechanism exceeds the predetermined threshold (block 1012) then the controller 140 disables operation of the saw 100 until the saw 100 undergoes a maintenance procedure (block 1016). For example, in one configuration the controller 140 ignores any input signals from the user interface 110 to activate the saw 100, and the motor 112 remains deactivated while the saw 100 is disabled. The controller 140 optionally generates an output indicated signal via the user interface 110 to alert the operator that the saw 100 is disabled and requires maintenance.

The process 1000 continues during a maintenance operation. In addition to any required maintenance to repair or replace mechanical or electrical components in the saw 100, the maintenance operation further includes resetting the counter value in the memory of the saw 100 to return the saw to operation (block 1020). In one embodiment, the maintenance process includes connection of an external programming device, such as a PC or other computerized programming device, to a maintenance port within the saw 100, such as a universal serial bus (USB) port, to both retrieve diagnostic data from the memory 142 and reprogram the memory 142 to reset the counter that stores the number of times that the implement reaction mechanism has been activated. The use of the external programming device enables the saw 100 to be re-enabled for use after the maintenance process while remaining disabled until the saw undergoes proper maintenance.

The process 1000 ensures that the saw 100 remains disabled until receiving maintenance in the event of an unusually large number of activations of the implement reaction mechanism 132. The maintenance operation ensures that all components within the saw 100 are operating properly and that the object detection system 102 accurately detects contact between an object other than a work piece and the saw blade 108.

Figure 11:
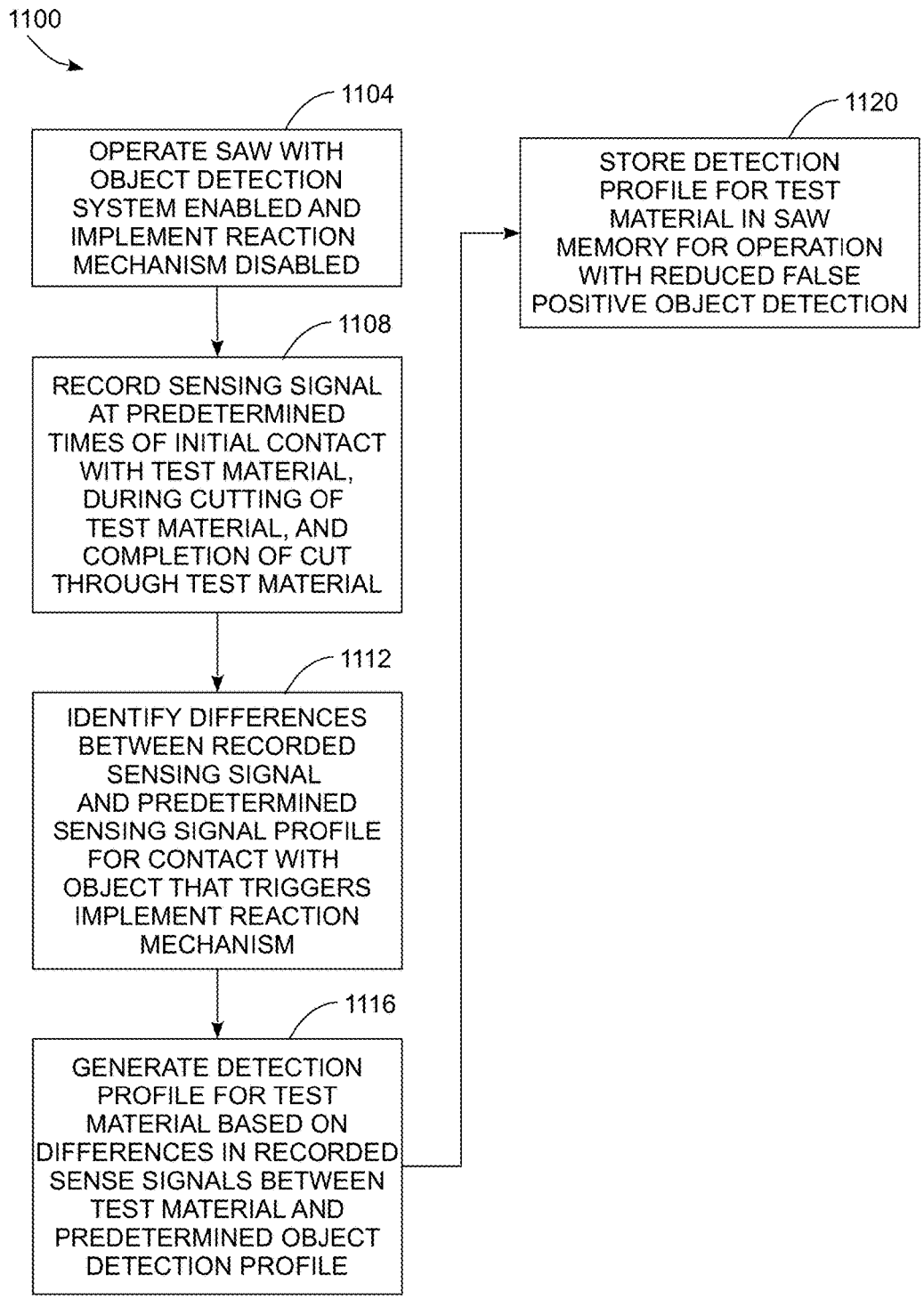
FIG. 11 is a block diagram of a process for measuring profiles of different types of materials used in work pieces for the object detection system in the saw of FIG. 2.

As described above, the object detection system 102 receives input signals in response to contact between the blade 108 and any object, including both work pieces which the saw cuts during normal operation, and other objects including potentially a body part of the saw operator that results in activation of the implement reaction mechanism. During operation of the saw 100, the object detection system 102 receives input signals corresponding to changes in the capacitance levels in the capacitor 124 formed by the plate 120 and blade 108 corresponding to both contact between work pieces and potential contact with objects other than work pieces. For example, in some situations wood with high moisture content has the potential to be confused with a portion of the body of a human operator during operation of the saw. FIG. 11 depicts a process 1100 that generates profiles of the signals generated by different types of material in various work pieces to improve the accuracy of object detection. In the discussion below, a reference to the process 1100 performing a function or action refers to the operation of a controller to execute stored program instructions to perform the function or action in association with one or more components in the saw. The process 1100 is described in conjunction with the saw 100 for illustrative purposes.

Process 1100 begins as the saw operates with the object detection system 102 enabled but the implement reaction mechanism 132 disabled (block 1104). The operation of the saw 100 without the implement reaction mechanism being enabled occurs under controlled conditions such as at a facility of the manufacturer or an approved maintenance facility. During the process 1100, the saw cuts various materials in work pieces that are suitable for use with the saw 100 but have the potential to produce sensing signals that could be misinterpreted as corresponding to a human body part or other object that should trigger the implement reaction mechanism 132 upon contact with the spinning blade 108.

Process 1100 continues as the saw 100 records sensing signals in the object detection system 102 that are produced at predetermined times when the work piece initially contacts the blade 108, during the cut as the work piece moves past the blade 108, and at the time of completion of the cut when the work piece disengages from the blade 108 (block 1108). The recorded sensing signal information typically includes spikes in the sensing signal that correlate to changes in the capacitance level in the capacitor 124. For example, the initial spike that occurs when the work piece initially contacts the rotating blade 108 may be similar to the initial spike that is generated when an object other than the work piece initially contacts the rotating blade 108.

In another embodiment of the process 1100, the saw 100 includes additional sensors other than the capacitive sensor formed by the capacitor 124 that can detect characteristics of the work piece material that can be distinguished from the body of a human operator. For example, one embodiment further includes one or more infrared sensors that are mounted on the riving knife 330 that is depicted in FIG. 3. The infrared sensors generate a profile of the frequency response of infrared light that is reflected from the work piece. The controller 140 is operatively connected to the infrared sensors to record the frequency response of the material in the work piece.

Process 1100 continues as the controller 140 or a processor in an external computing device identifies differences between the recorded sensing signal and the predetermined sensing signal profile for an object that would trigger the implement reaction mechanism in the saw 100 (block 1112). For example, as described above the controller 140 uses an adaptive thresholding process to identify spikes in the sensing current that correspond to a hand or other portion of the human body when in contact with the blade 108. The spike corresponding to the contact with the human hand includes both an amplitude profile and time profile. The controller 140 identifies differences in the amplitude and duration between the predetermined profile for a human body part and the initial spike that occurs when the work piece first contacts the rotating blade 108 and any subsequent spikes that occur as the blade 108 cuts the work piece and disengages from the work piece.

The controller 140 or external processor then generates a detection profile that is specific to the test material based on the differences between the recorded sense signals and the predetermined object detection profile for the human body (block 1116). In one embodiment, the controller 140 generates a profile with a range of amplitude values around the amplitude of the recorded spike in the sensing signal when the blade 108 engages the predetermined material in the work piece. The range of values for the amplitude of the spike does not include the threshold amplitude for the spike amplitude for the predetermine profile of the human operator to ensure that the controller 140 does not incorrectly identify a sensing signal corresponding to a human operator as a work piece. Thus, the size of the range of amplitude values that correspond to different work pieces varies based on the differences between the recorded spikes produced through contact between the blade 108 and the work piece material and the predetermined profile corresponding to a human body. The controller 140 similarly generates a time range corresponding to the duration of the spike in the sensing signal from the work piece based on differences between the time range of the spike from the work piece and an expected duration of the spike in the profile for contact with a human body. The updated profile enables the controller 140 to distinguish between sense signals from the capacitor 124 that correspond to contact between the blade 108 and a work piece of a predetermined type of material compared to potential contact with a portion of the human body.

As noted above, in an alternative embodiment the controller 140 generates a profile based on the data from the infrared sensors to identify the frequency response range of the material in the work piece and distinguish the frequency response range from a predetermined frequency response range that is associated with a human operator. The controller 140 uses a predetermined response range for the operator that is stored in the memory 142 to ensure that the frequency response range in the profile of the material does not overlap the predetermined profile for the human operator. For example, in one configuration the memory 142 stores a frequency response profile for near infrared responses that have a peak response at wavelengths of approximately 1080 nm and a minimum response at wavelengths of approximately 1580 nm for a wide range of human skin tones. Other types of materials for various work pieces have peak and minimum infrared frequency responses at different wavelengths, and the controller 140 generates a profile with a range of frequency responses for both peak and minimum response values at wavelengths that correspond to work pieces but do not overlap with the wavelengths corresponding to the responses of human skin.

During process 1100, the updated profile for the test material is stored in the memory 142 (block 1120). During subsequent operations with both the object detection system 102 and implement reaction mechanism 132 being enabled, the controller 140 uses the stored profile information for the test material to reduce potential occurrences of false positive detection events when changes in the sensing signal that occur due to contact between the work piece and the saw blade 108 are misinterpreted as corresponding to contact between the operator and the saw blade. For example, if the saw 100 is cutting a particular type of material that is stored in a profile in the memory 142, then the controller 140 continues to operate the saw 100 as long as any spikes in the sensing signal in the object detection system 102 remain within the amplitude and time duration ranges for the stored profile corresponding to the material type. In some configurations, the memory 142 stores profiles for multiple types of material that the saw 100 cuts during operation. The operator optionally provides an input to the saw 100 that specifies the type of material to be cut to enable the controller 140 to use a stored profile for the appropriate type of material in the work piece.

Figure 12:
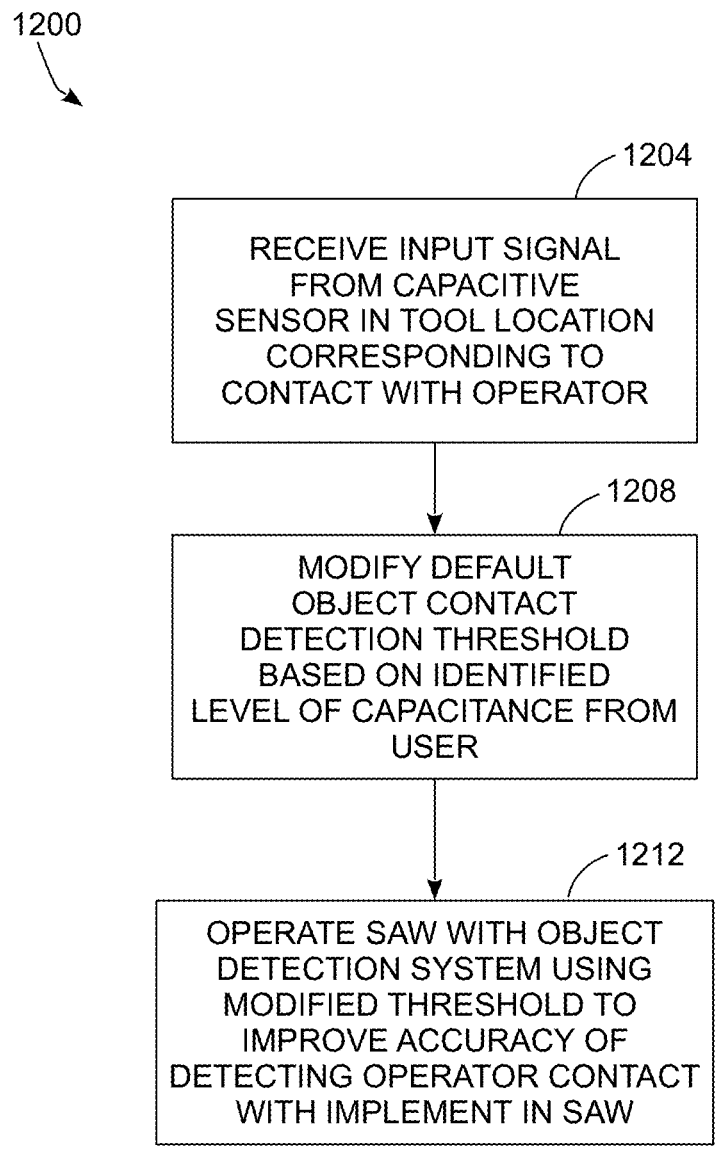
FIG. 12 is a block diagram of a process for measuring the capacitance in the body of an operator of the saw to adjust operation of the object detection system in the saw of FIG. 2.

As described above, the object detection system measures changes in the sensing signal through the capacitor 124 in response to contact between objects and the rotating saw blade 108. The memory 142 stores predetermined threshold information that the controller 140 uses with the adaptive threshold process described above to detect contact between the body of the human operator and the blade 108. However, the bodies of individual human operators may exhibit different capacitance levels both between individuals and the capacitance level of one individual may vary over time for a variety of reasons. Examples of factors that affect the capacitance levels of operators include, but are not limited to, the temperature and ambient humidity in the environment around the saw, the physiological makeup of each operator, the perspiration level of the operator, and the like. FIG. 12 depicts a process 1200 for measuring the level of capacitance of an individual operator during operation of the saw 100 to enable the saw 100 to adjust the object detection thresholds for different individuals. In the discussion below, a reference to the process 1200 performing a function or action refers to the operation of a controller to execute stored program instructions to perform the function or action in association with one or more components in the saw. The process 1200 is described in conjunction with the saw 100 for illustrative purposes.

Process 1200 begins as the saw 100 measures a capacitance level of the operator through a capacitive sensor that is formed in a handle or other predetermined contact location on a surface of the saw 100 that the operator touches during operation of the saw (block 1204). Using the illustration of FIG. 3 as an example, capacitive sensors in one or more of the rip fence 304, the front rail 310, the bevel adjustment handle 352, the height adjustment handle 354, or other surfaces of the saw that the operator touches during operation generate measurements of the capacitance level in the hands of the operator. The operator does not need to remain in continuous contact with the capacitive sensor during operation of the saw 100, but the controller 140 optionally updates the measured capacitance level when the operator touches one or more of the capacitive sensors.

Process 1200 continues as the controller 140 modifies the threshold level for detection of contact with an object, such as the body of the operator, other than the work piece (block 1208). The controller 140 decreases the default spike amplitude detection threshold for the sensing signal in response to a measured capacitance level that is less than a predetermined default level, which can occur when the operator has unusually dry skin or other environmental factors reduce the effective capacitance in the body of the operator. The controller 140 modifies the threshold based on the difference between a default capacitance level that is appropriate for a wide range of human operators and the measured capacitance level that may be higher or lower than the default level. Reducing the threshold level effectively increases the sensitivity for detection between the operator and the saw blade 108 in the saw 100. The controller 140 optionally increases the threshold in response to an identification of a large capacitance value in the operator. In some embodiments the controller 140 limits the maximum threshold level for object detection to ensure that the object detection system 102 retains the capability to detect contact between the operator and the blade 108 since increasing the detection threshold level effectively reduces the sensitivity of the object detection system 102.

Process 1200 continues as the saw 100 operates to cut work pieces and the object detection system 102 uses the modified detection threshold to detect potential operator contact with the blade 108 (block 1212). As described above, if the hand or other body part of the operator contacts the rotating blade 108, the controller 140 compares the amplitude of the measured spike in the sensing signal through the capacitor 124 to the modified threshold using the adaptive thresholding process described above. Since the controller 140 modifies the detection threshold based on the measured capacitance of the operator, the process 1200 enables the saw 100 to detect contact between the operator and the saw blade 108 with improved accuracy.

Figure 13A:
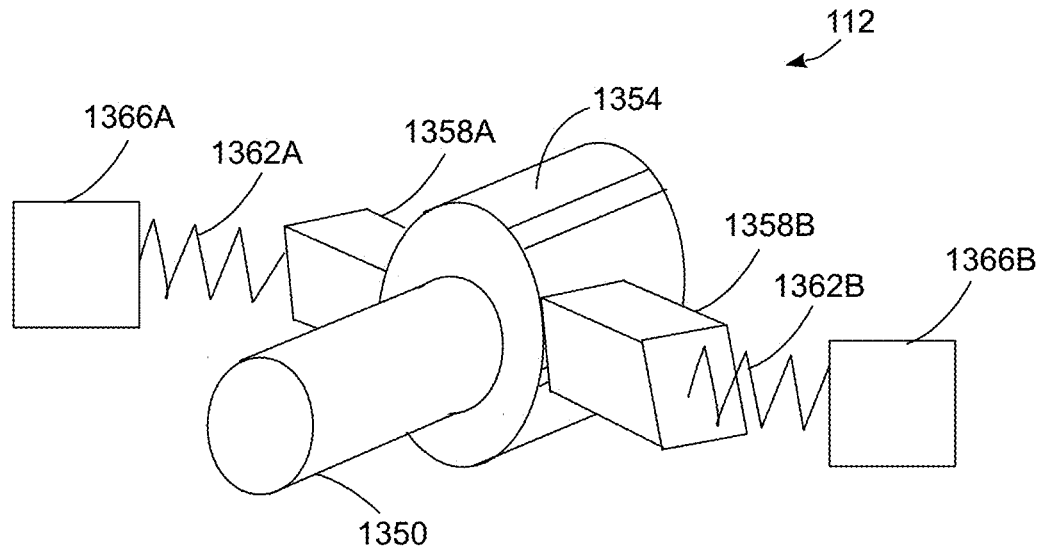
FIG. 13A is a schematic view of components in the motor of one embodiment of the saw of FIG. 2.

In the saw 100, the motor 112 includes one or more brushes that engage a commutator. The use of brushes in electric motors is well-known to the art. Over time, brushes experience wear, which reduces the efficiency of the motor and worn brushes often generate sparks. The sparks can be detrimental to operation of the motor 112 and in some circumstances the sparks generate electrical noise that is detected by the object detection system 102. FIG. 13A depicts an example of the shaft 1350, commutator 1354, and brushes 1358A and 1358B in the motor 112. Springs 1362A and 1362B bias the brushes 1358A and 1358B, respectively, into contact with the commutator 1354. In many embodiments, the brushes 1358A and 1358B are formed from graphite. In the motor 112, the mounts 1366A and 1366B are formed in a housing of the motor 112 and engage the springs 1358A and 1358B, respectively. In one embodiment, the mounts 1366A and 1366B include pressure sensors that measure the compressive force applied through the springs 1362A and 1362B. In another embodiment, the mounts 1366A and 1366B generate sensing currents through the springs 1362A and 1362B and the corresponding brushes 1358A and 1358B to identify the electrical resistance levels through the brushes.

Figure 13B:
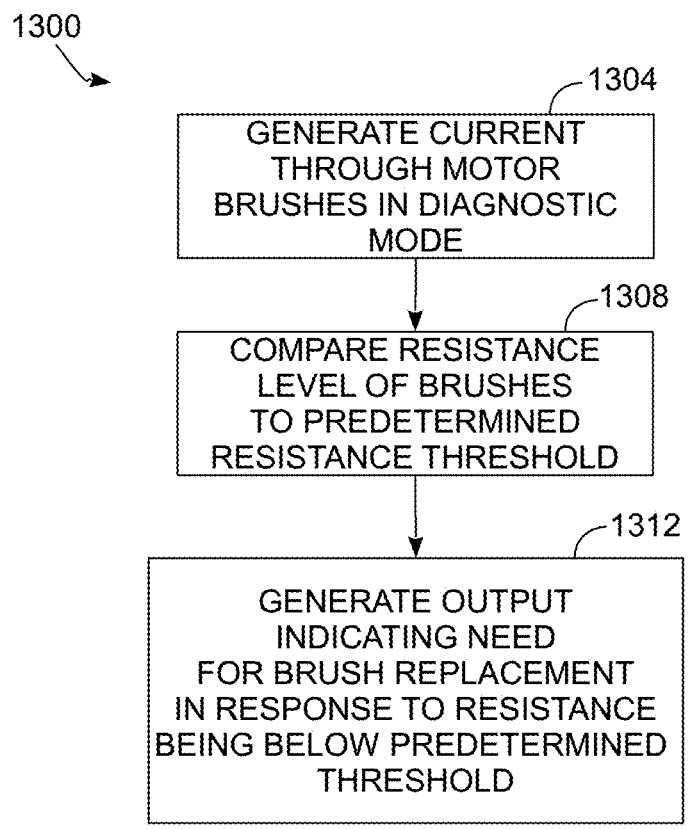
FIG. 13B is a block diagram of a process for measuring wear on a brush in the motor depicted in FIG. 13A based on electrical resistance in the brush.

Since worn brushes not only reduce the efficiency of operation of the motor 112, but may introduce additional electrical noise into the sensing signal for the object detection system 102, the saw 112 optionally detects brush wear in the motor 112 and generates an output to indicate that worn brushes should be replaced via the user interface 110. FIG. 13B depicts a first embodiment of a process 1300 for measuring brush wear in the motor 112. In the description below, a reference to the process 1300 performing an action or function refers to the operation of a controller, such as the controller 140 in the saw 100, to execute stored program instructions to perform the function or action in conjunction with other components in the saw 100.

During process 1300, an electrical source positioned in each of the mounts 1366A and 1366B generates an electrical current through the corresponding brushes 1358A and 1358B (block 1304). In one embodiment, the current passes through the cables that are connected to the brushes 1358A and 1358B for normal operation of the brushes 1358A and 1358B in the saw 100. In another configuration, the current passes through the springs 1362A and 1362B and the corresponding brushes 1358A and 1358B. The current is generated during a diagnostic mode when the saw motor 112 is otherwise deactivated and the level of the electrical current used in the process 1300 is well below a drive current that produces rotation in the motor shaft 1350 during operation of the motor 112. During process 1300, the controller 140 or a controller that is integrated with the motor 112 measures an electrical resistance level through the brushes and compares the measured electrical resistance level to a predetermined resistance threshold (block 1308). The measurement of the electrical resistance level includes, for example, a measurement of a voltage level or current level for the electrical current that flows through each of the brushes 1358A and 1358B in the diagnostic mode and an application of Ohm's law to find the resistance (e.g. R=E/I for a measured voltage E and predetermined current I or predetermined voltage E and measured current I). Once the resistance drops below a predetermined threshold, the controller 140 generates an output signal via the user interface 110 to indicate that the brushes should be replaced (block 1312). The resistance drops as the brushes wear and grow thinner, which reduces the total resistance through the springs 1362A and 1362B and the corresponding brushes 1358A and 1358B. In some configurations, the controller 140 also disables operation of the saw 100 until any worn brushes have been replaced and the controller 140 performs the process 1300 again to confirm that the new brushes are no longer worn.

Figure 13C:
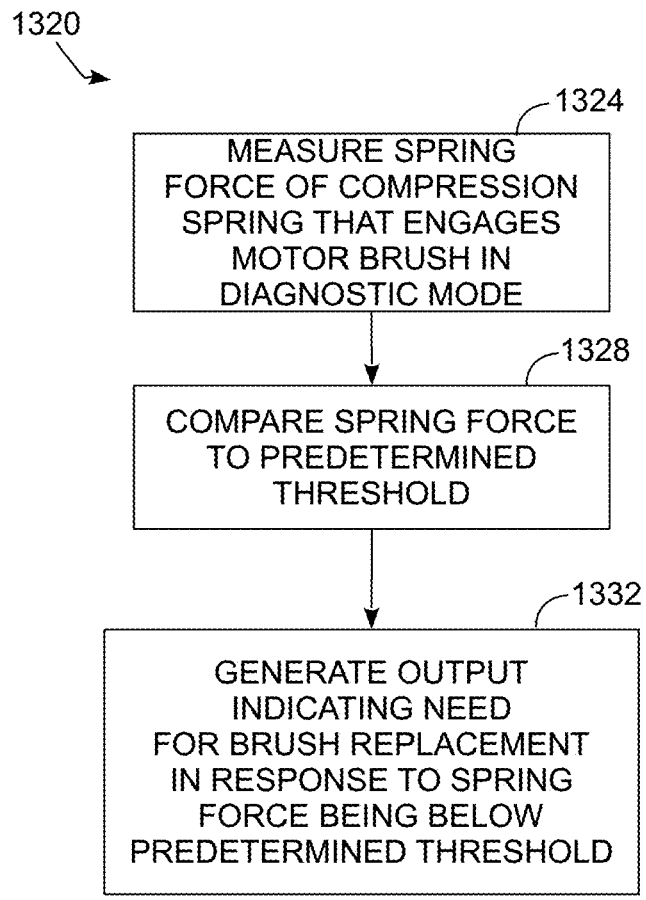
FIG. 13C is a block diagram of a process for measuring wear on a brush in the motor depicted in FIG. 13A based on a pressure measurement for a spring that biases the brush to a commutator in the motor.

FIG. 13C depicts a second embodiment of a process 1320 for measuring brush wear in the motor. In the description below, a reference to the process 1320 performing an action or function refers to the operation of a controller, such as the controller 140 in the saw 100, to execute stored program instructions to perform the function or action in conjunction with other components in the saw 100.

In the process 1320, the spring mounts 1366A and 1366B each include a pressure sensor that measures the compressive force of the corresponding springs 1362A and 1362B during a diagnostic mode when the motor 112 is deactivated (block 1324). As the brushes 1358A and 1358B experience wear, the corresponding springs 1362A and 1362B expand to bias the brushes onto the commutator 1354. The compressive force in the springs 1362A and 1362B decreases as the springs expand. The controller 140 or a controller in the motor 112 is operatively connected to the pressure sensors and compares the measured pressure levels from the pressure sensors to a predetermined pressure threshold (block 1328). Once the pressure sensors in the mounts 1366A and 1366B measure that the compressive force of the springs 1362A and 1362B has dropped below a predetermined threshold, the controller 140 generates an output signal via the user interface 110 to indicate that the brushes should be replaced (block 1332). In some configurations, the controller 140 also disables operation of the saw 100 until any worn brushes have been replaced and the controller 140 performs the process 1320 again to confirm that the new brushes are no longer worn.

Figure 14:
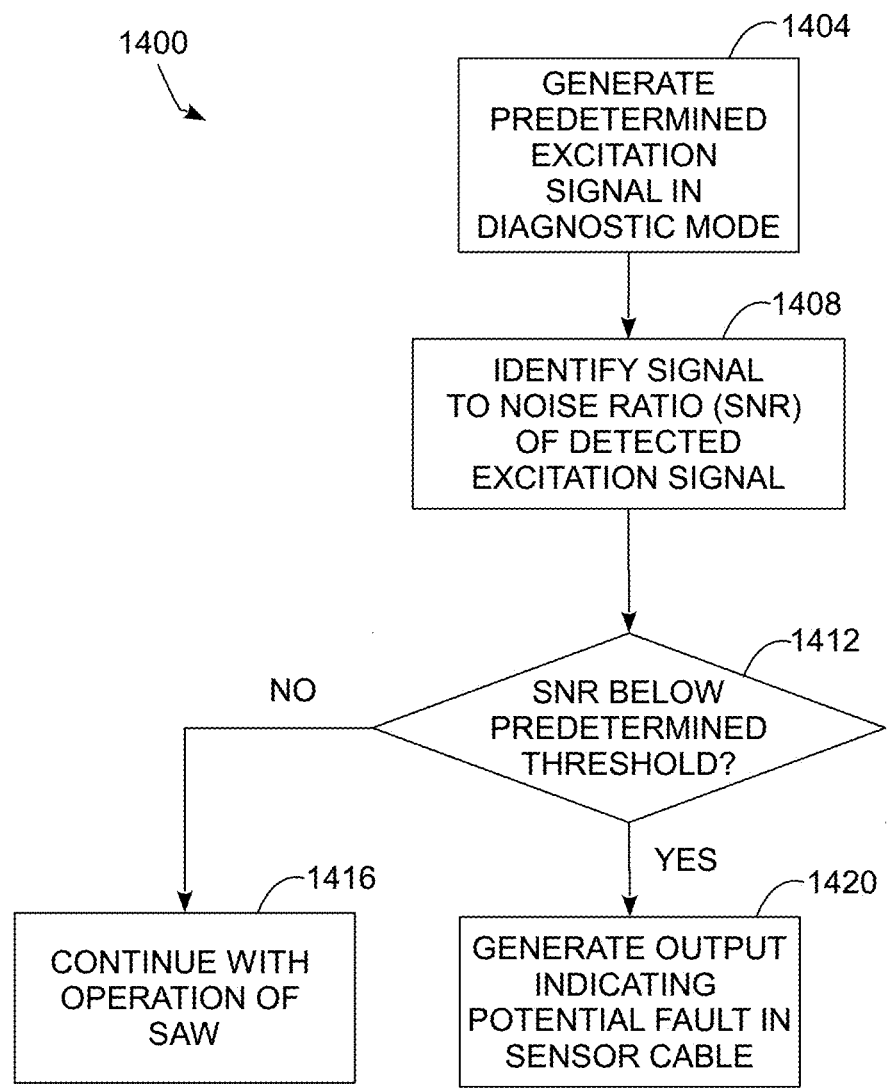
FIG. 14 is a block diagram of a process for diagnosing faults in the sensing cable of one embodiment of the saw of FIG. 2.

As described above, during operation the object detection system 102 receives sensing signals through a single sensing cable, such as the coaxial cable 720 depicted in FIG. 8B, that includes two different conductors. Within a high vibration environment such as the saw 100, the sensing cable 720 may experience wear and faults over time that eventually require cable replacement during saw maintenance. If the sensing cable 720 breaks or is disconnected from any of the PCB of the object detection system 102, the plate 120, or implement enclosure 118, then the PCB does not detect any sensing signal and can disable the saw 100 until the single sensing cable 720 is repaired. However, in some circumstances the sensing cable 720 experiences a "soft fault" in which the cable is not completely disconnected, but the cable continues to operate with greatly degraded performance in the saw. The PCB 102 still receives the sensing signal, but the fault within the sensing cable 720 introduces noise or attenuates the sensing signal, which reduces the accuracy of the object detection system 102. FIG. 14 depicts a process 1400 for diagnosing soft faults in the sensing cable 720. In the description below, a reference to the process 1400 performing an action or function refers to the operation of a controller, such as the controller 140 in the saw 100, to execute stored program instructions to perform the function or action in conjunction with other components in the saw 100.

Process 1400 begins as the object detection system 102 generates a predetermined excitation signal during a diagnostic mode (block 1404). In one embodiment, the controller 140 activates the clock source 144 to generate the same sinusoidal sensing signal that is used during operation of the saw 100 using amplitude modulation. In another embodiment, the clock source 144 produces an impulse train including a series of delta pulses at a predetermined frequency to enable the controller 140 to receive an output corresponding to the unit impulse response of through the sensing cable 720 and capacitor 124. In further embodiments, the clock source 144 generates any suitable predetermined signal that enables diagnosis of potential faults within the sensing cable 720. During the diagnostic mode, the motor 112 in the saw 100 is deactivated and there is minimal electrical noise present within the saw.

Process 1400 continues as the controller 140 identifies a signal to noise ratio (SNR) of the detected excitation signal (block 1408). In the saw 100, the controller 140 detects a return signal in response to the excitation signal from the clock source 144 and the amplifier 146 that passes through the sensing cable 720 and the plate 120 and saw blade 108 of the capacitor 124. Since the clock source 144 and driving amplifier 146 generate the excitation signal with a predetermined amplitude and modulation, the controller 140 identifies the SNR using a predetermined measurement technique that is otherwise known to the art. Of course, even in a an otherwise deactivated saw the excitation signal experiences some degree of attenuation through the sensing cable 720 and capacitor 124, and some degree of noise, such as Johnson-Nyquist noise, is always present within the sensing circuit. As used in the context of the process 1400, a measurement of SNR also includes a measurement of signal strength attenuation that does not include a direct measurement of noise. For example, the predetermined excitation signal is generated with a predetermined amplitude and the controller 140 measures the amplitude of the return signal. Some level of attenuation in the return signal is expected and a predetermined amplitude level for the signal strength of the return signal for a properly functioning sensing cable is identified empirically and stored in the memory 142. However, if the amplitude of the return signal drops below a predetermined level, then the controller 140 identifies a potential fault in sensing cable 720.

In an alternative configuration, the sensing cable 720 includes a third conductor that is electrically isolated from the first conductor and second conductor in the sensing cable. In one embodiment, the third conductor is formed as part of a second twisted pair in the sensing cable 720, while in another embodiment the sensing cable includes two coaxial elements that form three separate conductors. One end of the third conductor is connected to the plate 120 in a similar manner to the first conductor as depict in FIG. 8C. The other end of the third conductor is connected to an analog to digital converter (ADC) that is mounted to the PCB of the object detection system to provide a digitized version of the sensing signal to the controller 140. During the process 1400, the controller 140 measures a return signal based on the excitation signal through the third conductor instead of through the first conductor and the second conductor.

The controller 140 identifies if the measured SNR for the excitation signal drops below a predetermined minimum SNR ratio that is suitable for operation of the object detection system 102 (block 1412). A fault in the sensing cable 720 attenuates the level of the received signal, introduces additional noise into the sensing cable 720, or produces both an attenuation of signal strength and increase in noise that degrades the SNR. If the SNR remains above the predetermined threshold, then the sensing cable 720 is considered functional and the saw 100 continues with operation (block 1416). However, if the measured SNR falls below the predetermined threshold, then the controller 140 generates an output indicating a potential fault in the sensing cable (block 1420). In the saw 100, the controller 140 generates the output via the user interface 110 to alert an operator to a potential cable fault. In some configurations, the controller 140 disables operation of the saw 100 until the sensing cable 720 is repaired or replaced.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A method for monitoring brush wear in a motor of a saw comprising:
   generating, with a sensor connected to a brush in a motor of the saw, a first signal corresponding to a level of wear in the brush, the generating of the first signal further comprising:
      generating, with a current source in the motor, an electrical signal that passes through the brush; and
      identifying, with a controller, a level of electrical resistance through the brush with reference to the first signal from the sensor;
   identifying, with the controller, a level of wear for the brush with reference to the first signal, the identifying of the level of wear for the brush further comprising:
      identifying, with the controller, that the level of wear in the brush exceeds a predetermined threshold in response to the level of electrical resistance being below a predetermined threshold; and
   generating, with the controller and a user interface device, an output requesting replacement of the brush in response to the identified level of wear exceeding the predetermined threshold.

2. The method of claim 1, the generating of the first signal further comprising:
   generating with the sensor the first signal corresponding to at least one of a level of electrical current or voltage in the brush.

3. The method of claim 1 further comprising:
   disabling, with the controller, operation of the motor in response to the identified level of wear exceeding the predetermined threshold.

4. The method of claim 1 wherein the sensor generates the first signal during a diagnostic mode in which the motor is deactivated.

5. A system for measuring brush wear of a motor in a saw comprising:
   a motor in a saw;
   a brush in the motor;
   a sensor in the motor, the sensor being configured to generate a first signal corresponding to a level of wear in the brush, the sensor further comprising:
      a current source in the motor configured to generate an electrical signal that passes through the brush; and
   the sensor being further configured to:
      generate the first signal corresponding to at least one of a level of electrical current or voltage based on the electrical signal that passes through the brush;
   a user interface device; and
   a controller operatively connected to the motor, the sensor, and the user interface device, the controller being configured to:
      receive the first signal from the sensor;
      identify a level of electrical resistance through the brush with reference to the first signal from the sensor;
      identify that the level of wear for the brush exceeds a predetermined threshold in response to the level of electrical resistance being below a predetermined threshold; and
      operate the user interface device to generate an output requesting replacement of the brush in response to the identified level of wear exceeding the predetermined threshold.

6. The system of claim 5, the controller being further configured to:
   disable operation of the motor in response to the identified level of wear exceeding the predetermined threshold.

7. The system of claim 5 wherein the sensor generates the first signal during a diagnostic mode in which the motor is deactivated.

8. A method for operation of a saw with an implement reaction mechanism comprising:
   detecting, with an object detection system in the saw, contact between an object other than a work piece and an implement in the saw during operation of the saw;
   activating, with the object detection system, the implement reaction mechanism in the saw;
   incrementing, with a controller in the object detection system, a counter in a memory corresponding to a number of times that the implement reaction mechanism has been activated; and
   disabling, with the controller, operation of the saw in response to the counter exceeding a predetermined threshold.

9. The method of claim 8 further comprising:
   resetting, with an external programming device, the counter in the memory during a maintenance operation; and
   enabling, with the controller, operation of the saw in response to the counter being reset.

10. The method of claim 8 further comprising:
    generating, with a user interface device, an output indicating that the saw is disabled and requires service in response to the counter exceeding the predetermined threshold.

* * * * *